US011328850B2

(12) United States Patent
Kim et al.

(10) Patent No.: US 11,328,850 B2
(45) Date of Patent: May 10, 2022

(54) MAGNETIC FILM INCLUDING REGULAR PATTERN OF THROUGH-CRACKS

(71) Applicant: 3M INNOVATIVE PROPERTIES COMPANY, St. Paul, MN (US)

(72) Inventors: Jinwook Kim, Hwaseong-si (KR); Seong-Woo Woo, Gwangju-si (KR); Jung Ju Suh, Seoul (KR); Matthew R.C. Atkinson, Grant, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 36 days.

(21) Appl. No.: 16/904,997

(22) Filed: Jun. 18, 2020

(65) Prior Publication Data
US 2021/0005371 A1    Jan. 7, 2021

Related U.S. Application Data

(60) Provisional application No. 62/869,704, filed on Jul. 2, 2019.

(51) Int. Cl.
| | |
|---|---|
| *H01F 10/08* | (2006.01) |
| *H05K 9/00* | (2006.01) |
| *H01F 27/36* | (2006.01) |
| *H01F 1/153* | (2006.01) |
| *H01F 38/14* | (2006.01) |

(52) U.S. Cl.
CPC .......... *H01F 10/08* (2013.01); *H01F 27/366* (2020.08); *H05K 9/0075* (2013.01); *H01F 1/15333* (2013.01); *H01F 1/15366* (2013.01); *H01F 38/14* (2013.01); *Y10T 428/32* (2015.01)

(58) Field of Classification Search
None
See application file for complete search history.

(56) References Cited

U.S. PATENT DOCUMENTS

| | | | |
|---|---|---|---|
| 10,297,380 B2* | 5/2019 | Kim ................. | H01F 38/14 |
| 10,861,757 B2* | 12/2020 | Yazaki ............ | H01L 25/165 |
| 2008/0158848 A1* | 7/2008 | Free ................. | G06F 3/046 |
| | | | 361/818 |
| 2012/0062435 A1* | 3/2012 | Kato ................ | H01Q 7/06 |
| | | | 343/787 |

(Continued)

FOREIGN PATENT DOCUMENTS

| | | |
|---|---|---|
| KR | 10-1643924 | 11/2016 |
| KR | 10-1843258 | 3/2018 |
| KR | 10-1912283 | 10/2018 |

OTHER PUBLICATIONS

Wikipedia entry for Magnetic Reluctance (Year: 2021).*

*Primary Examiner* — Kevin M Bernatz
(74) *Attorney, Agent, or Firm* — Clifton F. Richardson

(57) ABSTRACT

A magnetic film includes one or more magnetically conductive layers. Each magnetically conductive layer is cracked to form a plurality of first through-cracks defining a plurality of magnetically conductive segments. The first through-cracks extend along a first direction and form a first regular pattern along an orthogonal second direction at a first pitch P1, such that a Fourier transform of the first regular pattern has a first peak along the second direction at a first spatial frequency corresponding to the first pitch P1. The first through-cracks have an average length L1 along the first direction. L1/P1 is greater than or equal to 5.

15 Claims, 21 Drawing Sheets

(56) References Cited

U.S. PATENT DOCUMENTS

| | | | |
|---|---|---|---|
| 2014/0017486 A1* | 1/2014 | Yoo | B32B 27/36 |
| | | | 428/325 |
| 2014/0239892 A1* | 8/2014 | Sawa | H01F 38/14 |
| | | | 320/108 |
| 2016/0055952 A1* | 2/2016 | Watanabe | G01C 17/28 |
| | | | 33/361 |
| 2018/0315527 A1 | 11/2018 | Lee | |
| 2018/0366834 A1* | 12/2018 | Graff | H01F 1/24 |
| 2018/0375210 A1* | 12/2018 | Graff | H01Q 17/00 |

\* cited by examiner

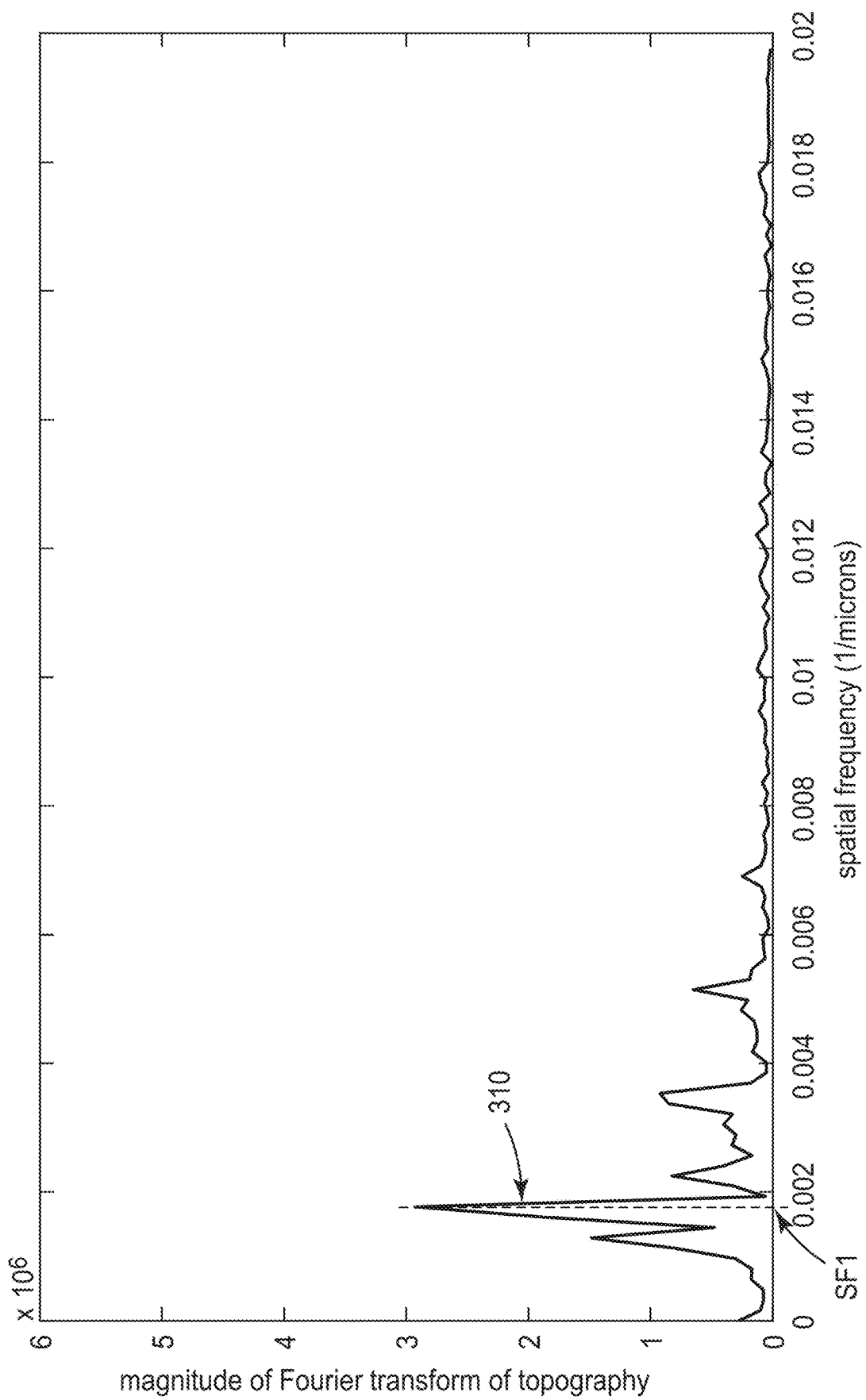

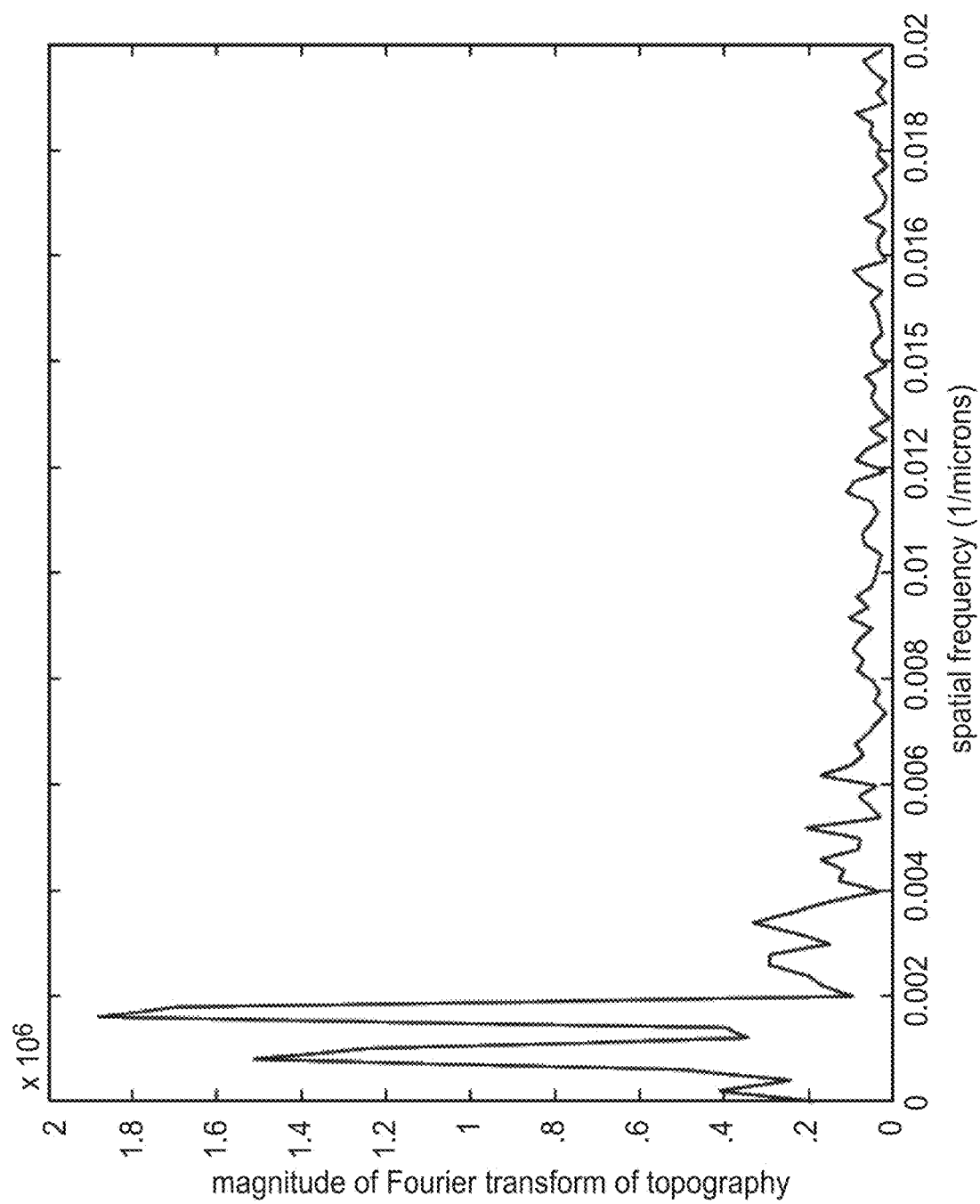

MAGNETIC FILM INCLUDING REGULAR PATTERN OF THROUGH-CRACKS

BACKGROUND

Magnetic films can be used for electromagnetic interference shielding, for example.

SUMMARY

In some aspects of the present description, a magnetic film including one or more magnetically conductive layers is provided. Each magnetically conductive layer is cracked to form a plurality of first through-cracks defining a plurality of magnetically conductive segments. The first through-cracks extend along a first direction and form a first regular pattern along an orthogonal second direction at a first pitch P1, such that a Fourier transform of the first regular pattern includes a first peak along the second direction at a first spatial frequency corresponding to the first pitch P1. The first through-cracks have an average length L1 along the first direction. $L1/P1 \geq 5$.

In some aspects of the present description, a magnetic film including one or more magnetically conductive layers is provided. Each magnetically conductive layer defines a plurality of through-cracks therein, such that when the magnetic film is laid substantially flat and a magnetic coil is disposed proximate the magnetic film with the magnetic coil generating magnetic flux lines that traverse substantially parallel to, and extend across, at least a portion of the magnetic film, the magnetic coil has a first inductance I1 at 200 kHz when the magnetic film has a first in-plane orientation, and a second inductance I2 at 200 kHz when the magnetic film is rotated in-plane relative to the magnetic coil by an angle greater than about 15 degrees to have a second in-plane orientation. $I1>I2$.

In some aspects of the present description, a magnetic film including one or more magnetically conductive layers cracked to form pluralities of at least first and second through-cracks defining a plurality of magnetically conductive segments is provided. The first through-cracks extend along a first direction and form a first regular pattern along an orthogonal second direction, and the second through-cracks extend along a third direction, different than the first direction, and form a second regular pattern along an orthogonal fourth direction such that a two-dimensional Fourier transform of the first and second regular patterns comprises respective first and second peaks along the respective second and fourth directions. In a top plan view, the first through-cracks have an average width V1 along the second direction, and the second through-cracks have an average width V2 along the fourth direction. $V1>V2$.

In some aspects of the present description, a magnetic film including one or more magnetically conductive layers is provided. Each magnetically conductive layer defines a plurality of through-cracks therein, such that when the magnetic film is laid substantially flat and a magnetic coil is disposed proximate the magnetic film with the magnetic coil generating magnetic flux lines that traverse substantially parallel to, and extend across, at least a portion of the magnetic film, the magnetic coil has a first resistance R1 at 200 kHz when the magnetic film has a first in-plane orientation, and a second resistance R2 at 200 kHz when the magnetic film is rotated in-plane relative to the magnetic coil by an angle greater than about 15 degrees to have a second in-plane orientation. $R1>R2$.

In some aspects of the present description, a magnetic film is provided. The magnetic film includes one or more magnetically conductive layers defining a plurality of through-cracks therein, such that when the magnetic film is laid substantially flat and a magnetic coil is disposed proximate the magnetic film with the magnetic coil generating magnetic flux lines at 200 kHz that traverse substantially parallel to, and extend across, at least a portion of the magnetic film, the magnetic coil has maximum inductance Imax when the magnetic film has a first in-plane orientation, and a minimum inductance Imin when the magnetic film is rotated in-plane relative to the magnetic coil to have a different second in-plane orientation. $Imax/Imin>1.5$.

In some aspects of the present description, a magnetic film is provided. The magnetic film includes one or more magnetically conductive layers cracked to form a plurality of through-cracks forming a regular pattern, such that when the magnetic film is laid substantially flat and an assembly is formed by disposing a magnetic coil proximate the magnetic film with the magnetic coil generating magnetic flux lines that traverse substantially parallel to, and extend across, at least a portion of the magnetic film, the magnetic coil has an inductance that is greater than an inductance of a comparative assembly that has a same construction except that the one or more conductive layers of the magnetic film of the comparative assembly are cracked to form a plurality of first through-cracks forming an irregular pattern, even when a number of turns in the magnetic coil of the comparative assembly is increased by about 30%.

In some aspects of the present description, a magnetic film including a first magnetically conductive layer including a plurality of discrete sections is provided. Each section is cracked to form a plurality of through-cracks extending along a first direction and forming a regular pattern along an orthogonal second direction at a first pitch such that a Fourier transform of the regular pattern includes a peak along the second direction at a spatial frequency corresponding to the first pitch. The second direction for at least one section in the plurality of discrete sections is different from the second direction for at least one other section in the plurality of discrete sections.

BRIEF DESCRIPTION OF THE DRAWINGS

FIGS. 4B-4C are plots of the magnitude of the Fourier transform of FIG. 4A along different directions;

FIGS. 13A-13B are plots of the magnitude of a Fourier transform of the height profile of the magnetically conductive layer of FIG. 12 along different directions.

DETAILED DESCRIPTION

Figure 1A:
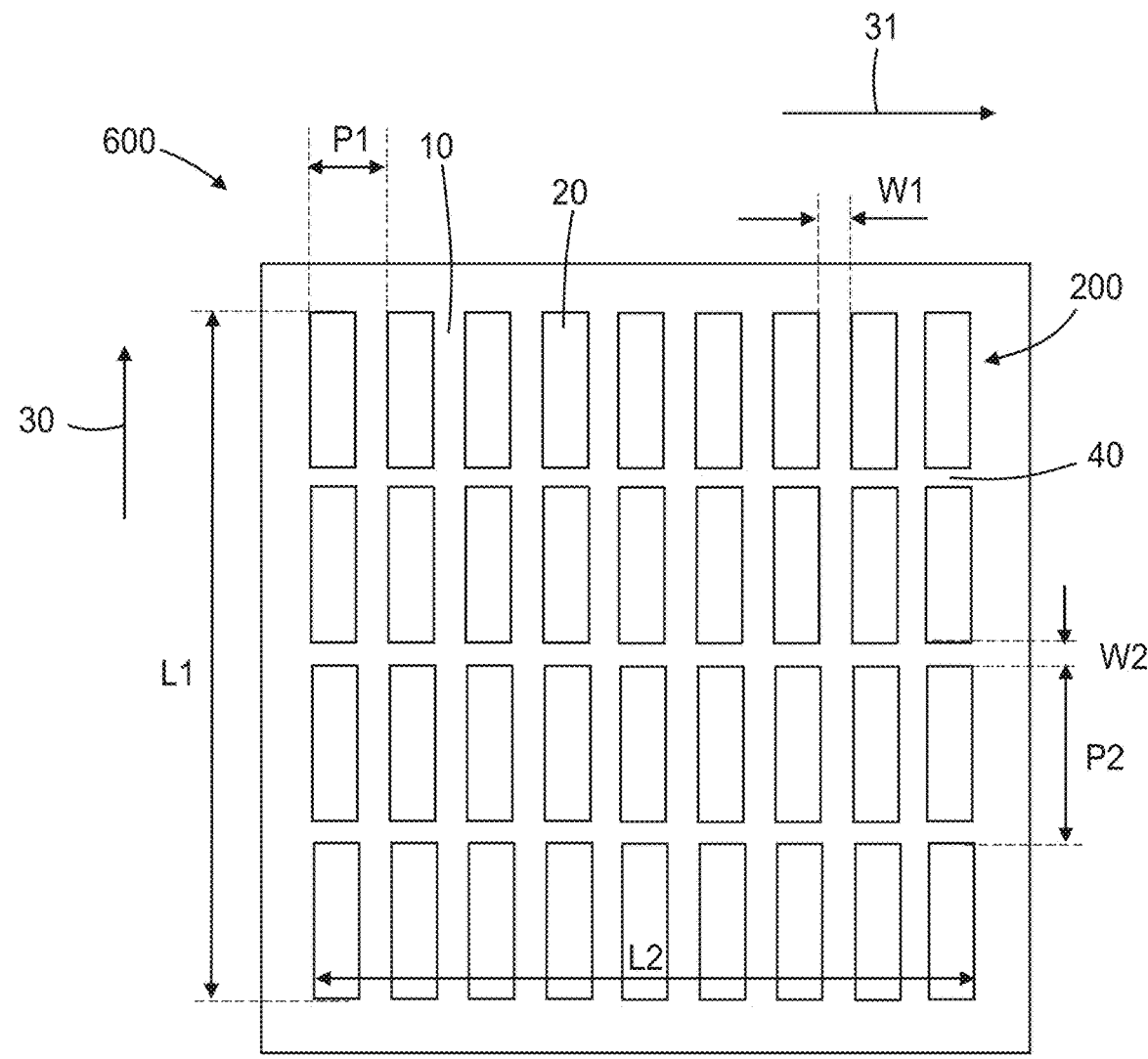
FIG. 1A is a schematic top plan view of a magnetic film.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

The magnetic films of the present description can be used in a variety of applications. For example, the magnetic films can be used in electronic devices where magnetic shielding is desired. The magnetic films can be useful in applications such as wireless power transfer, wireless charging, wireless powered communication (WPC), near field communication (NFC), magnetic secure transmission (MST) and/or wireless magnetic communication (WMC), for example.

In some embodiments, the magnetic film includes one or more magnetically conductive layers where at least one of the layers is cracked to form a regular pattern of through-cracks. It has been found that the pattern of through-cracks can be selected to increase the effective permeability of the magnetic film (e.g., as reflected in the inductance of a magnetic coil proximate the magnetic film). For example, the pattern of through-cracks can have an orientation such that the magnetic film has a higher effective permeability for magnetic fields aligned with the orientation of the pattern of through-cracks than for magnetic fields misaligned with the orientation of the pattern of through-cracks. In some embodiments, the magnetic film has a substantially higher effective permeability than a comparative magnetic film that has been cracked to form a plurality of through-cracks forming an irregular pattern. The increased effective permeability can result in significantly increased transfer distance in wireless power or data transfer applications, for example.

A magnetically conductive material or layer can be understood to be a material or layer having a relative permeability of at least 2. In some embodiments, a magnetically conductive layer has a relative permeability of greater than 2, or greater than 10, or greater than 100, or greater than 500, or greater than 1000, or greater than 2000. A magnetically conductive layer may be magnetically soft. A soft magnetic material or layer can be understood to be a material or layer having a coercivity of no more than 1000 A/m. Coercivity is a measure of the magnetic field strength needed to demagnetize a material. Soft magnetic materials or magnetic materials having low coercivity can be described as magnetic materials that are easily demagnetized. In some embodiments, a magnetically conductive layer has a coercivity of less than 1000 A/m, or less than 100 A/m, or less than 50 A/m, or less than 20 A/m.

The relative permeability refers to the real part of the complex relative permeability, unless indicated otherwise. Magnetic and electric properties (e.g., relative permeability, coercivity, electrical resistivity) refers to the respective property evaluated at 200 kHz, unless indicated differently, and determined at room temperature (e.g., 22° C.), unless indicated differently.

Any suitable magnetic material can be used for a magnetically conductive layer. In some embodiments, a layer of an iron alloy that is electrically conductive before cracking is used as a magnetically conductive layer. In some such embodiments, the layer is cracked which reduces the electrical conductance of the layer and reduces eddy current losses in the layer. The alloy can be a crystalline alloy including any two or all three of iron, cobalt, or nickel. Additional elements can optionally be added to modify properties such as magnetostriction, resistivity, permeability, saturation induction, coercivity, remanence, and/or corrosion, for example. Examples of such alloys include NiFe, NiFeMo, FeSi, FeAlSi, and FeCo. Amorphous alloys may also be used. For example, amorphous alloys including cobalt and/or iron with metalloids such as silicon and boron may be used. Such alloys are known in the art. Nanocrystalline materials such as nanocrystalline alloys may also be used. For example, nanocrystalline alloys including iron, silicon and/or boron, and optional other elements added to control the nucleation and growth of nanocrystals on annealing may be used. Many of these alloys include iron, silicon, boron, niobium, and copper. Useful FeSiBNbCu alloys include those available from VACUUMSCHMELZE GmbH & co. under the tradename VITROPERM and those available from Hitachi Metals, Ltd. under the tradename FINEMET. In some embodiments, a magnetic film includes one or more magnetically conductive layers that includes a nanocrystalline alloy. In some embodiments, the nanocrystalline alloy includes iron and at least one of silicon, aluminum, boron, niobium, copper, cobalt, nickel, or molybdenum. In some embodiments, the nanocrystalline alloy includes iron, silicon, boron, niobium, and copper.

In some embodiments, a magnetically conductive layer may be formed from an electrically conductive material (e.g., an electrical resistivity of no more than 200μΩ cm) or from an electrically insulative material (e.g., an electrical resistivity of at least 100 Ωm). In some embodiments, the electrically conductive material has as an electrical resistivity of less than 200μΩ cm, or less than 100 μΩ cm, or less than 50μΩ cm, or less than 20μΩ cm, or less than 10μΩ cm. In some embodiments, the electrically insulative material has as an electrical resistivity of greater than 100 Ωm, or greater than 200 Ωm, or greater than 500 Ωm, or greater than 1000 Ωm.

In some embodiments, a magnetically conductive layer is formed from an electrically insulative polyoxide material. Useful polyoxide materials include ferrites. Ferrites include oxides of iron and at least one other metal. Examples of useful ferrites include soft cubic ferrite materials, such as MnZn-ferrites or NiZn-ferrites. Such materials are available from many suppliers, such as Ferroxcube, for example. In some embodiments, a magnetically conductive polyoxide layer contains iron and manganese. In some such embodiments, the magnetically conductive polyoxide layer contains zinc. In some embodiments, the magnetically conductive polyoxide layer further includes one or more of silicon, calcium, titanium, tin, cobalt, niobium, tantalum, vanadium, molybdenum, zirconium, or bismuth.

In some embodiments, a magnetically conductive layer includes particles (e.g., magnetically conductive filler) dispersed in a binder (e.g., at least one of a thermoset adhesive, an epoxy, or a mixture including an epoxy). The magnetically conductive filler can be or include particles of any of the magnetic materials described elsewhere herein. In some embodiments, the particles are metallic particles which may be or include an iron-silicon-boron-niobium-copper alloy, for example, or which may be or include an iron-aluminum-silicon alloy (e.g., sendust), for example. In some embodiments, the particles are ferrite particles such as manganese-zinc ferrite particles or nickel-zinc ferrite particles. Other suitable materials for the particles, or for a continuous (before cracking) magnetically conductive and/or soft magnetic layer, include permalloy, molybdenum permalloy, and supermalloy. Combinations of different particles may also be used. In some embodiments, the particles include metallic particles which include at least one of an iron-silicon-boron-niobium-copper alloy or an iron-aluminum-silicon alloy. The particles can have any suitable shape and size. In some embodiments, the particles are flakes. A flake may have a thickness small (e.g., smaller by a factor of at least 4, or at least 8) compared to a largest lateral dimension of the flake and may have an irregular edge shape, for example.

Figure 1B:
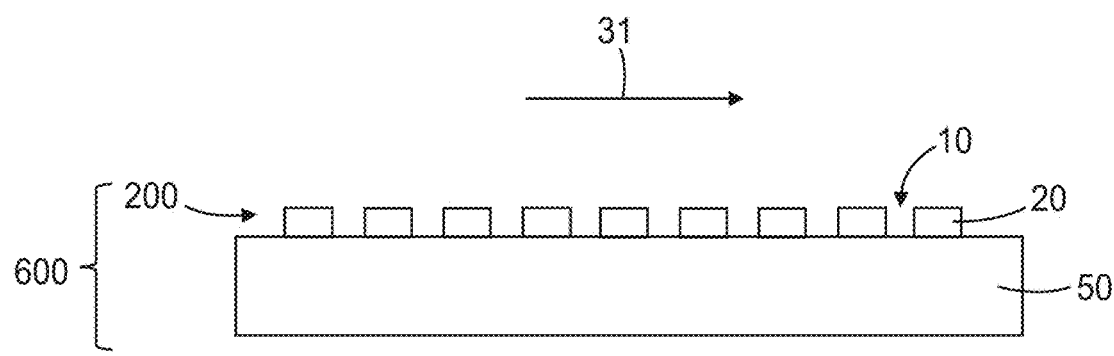
FIG. 1B is a schematic end view of the magnetic film of FIG. 1A.
Figure 1C:
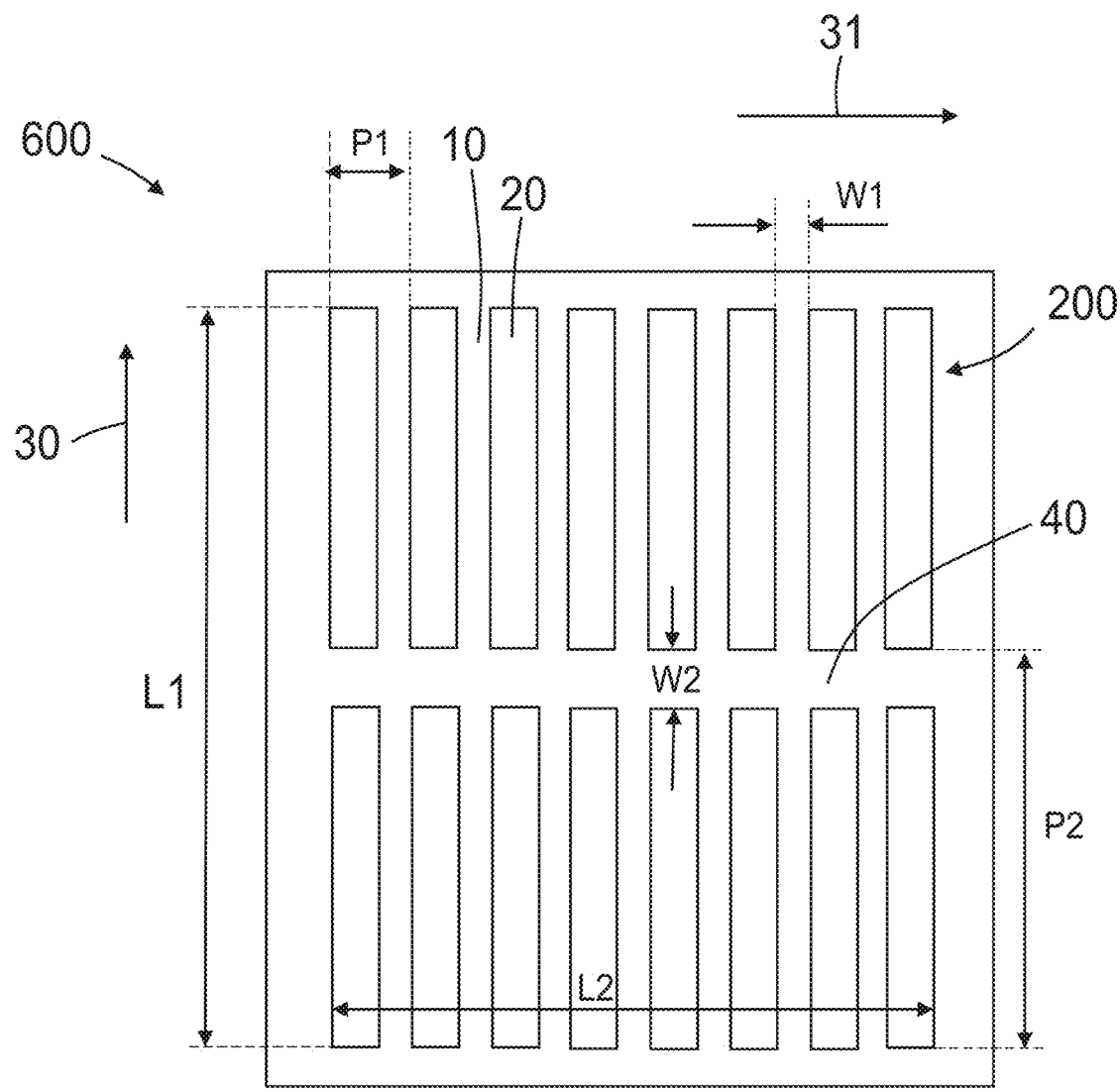
FIG. 1C is a schematic top plan view of another magnetic film.
Figure 2A:
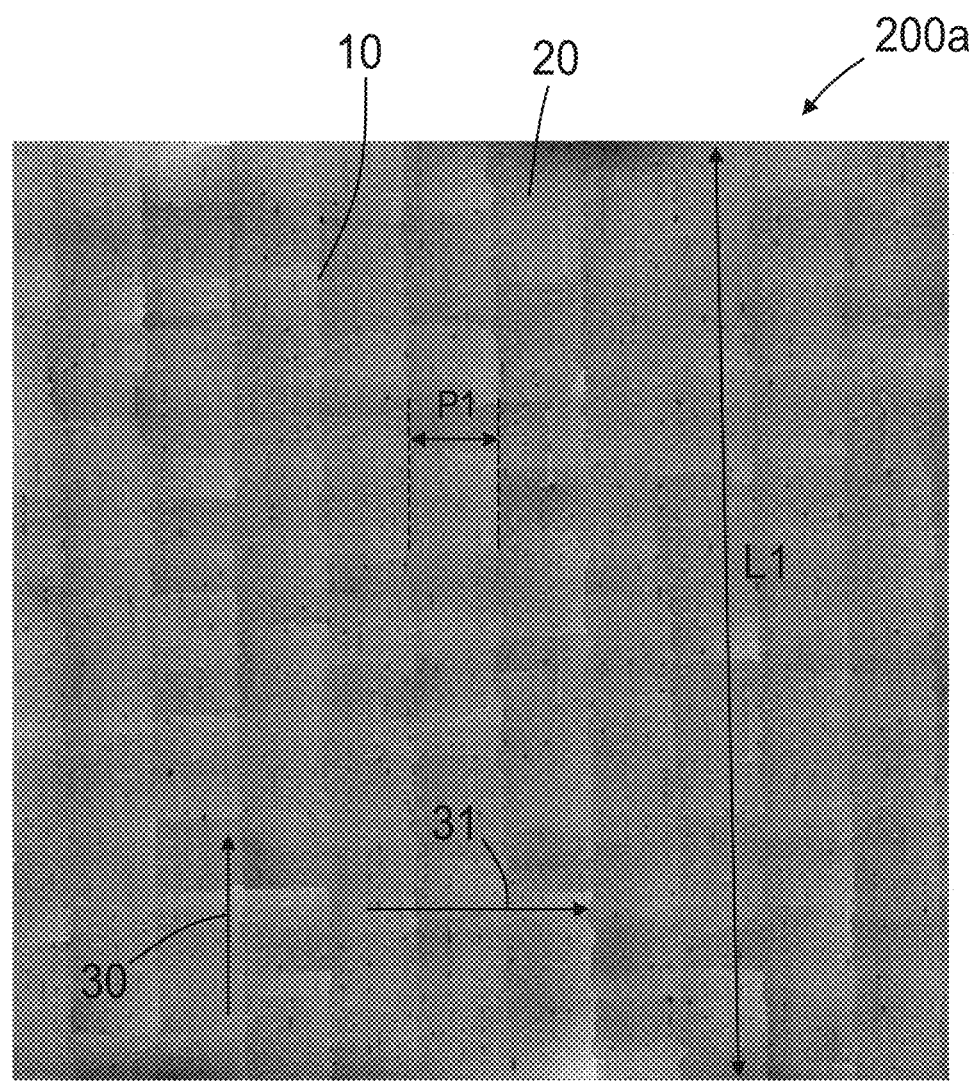
FIGS. 2A-2B are images of magnetically conductive layers.
Figure 2B:
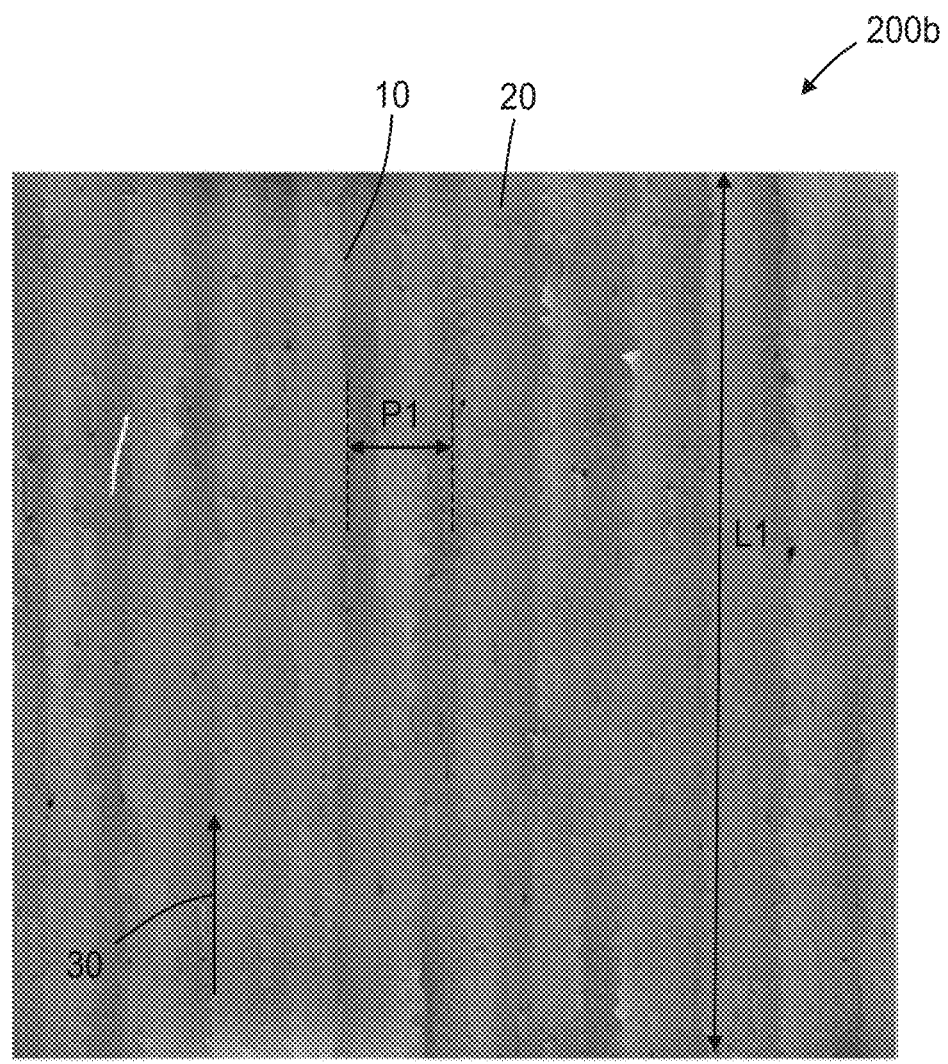
Figure 3:
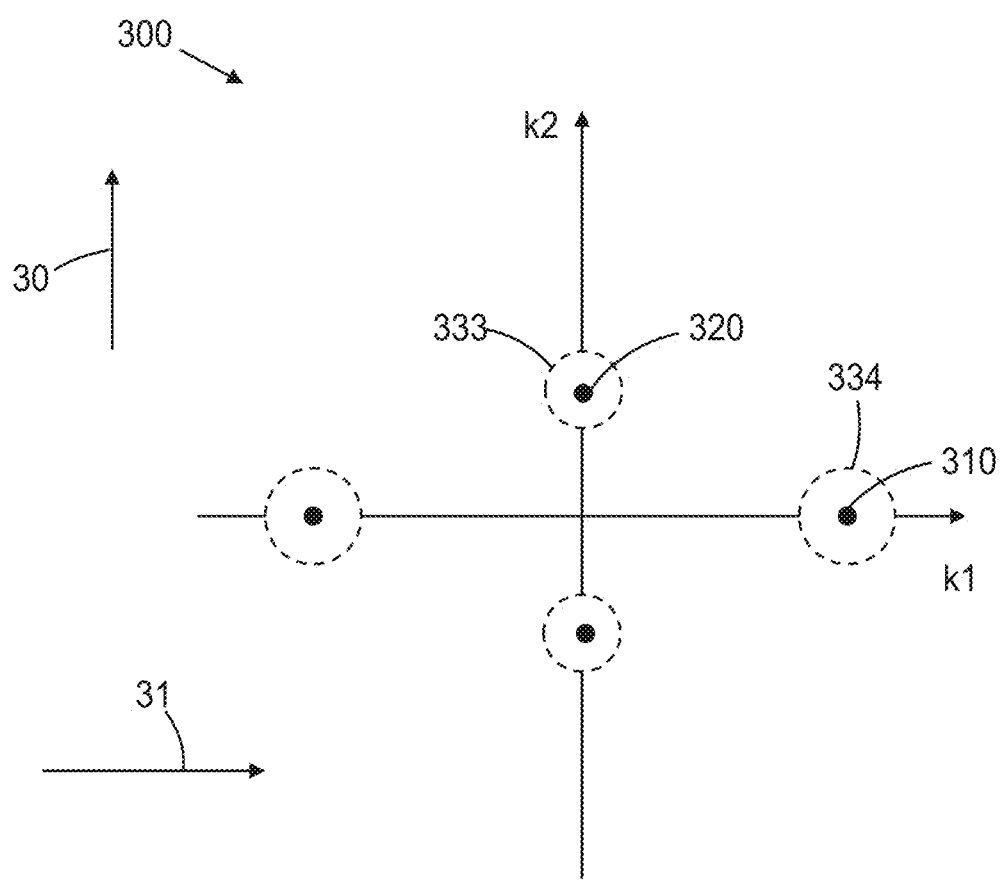
FIG. 3 is a schematic plot of a Fourier transforms of a regular pattern of through-cracks.
Figure 4A:
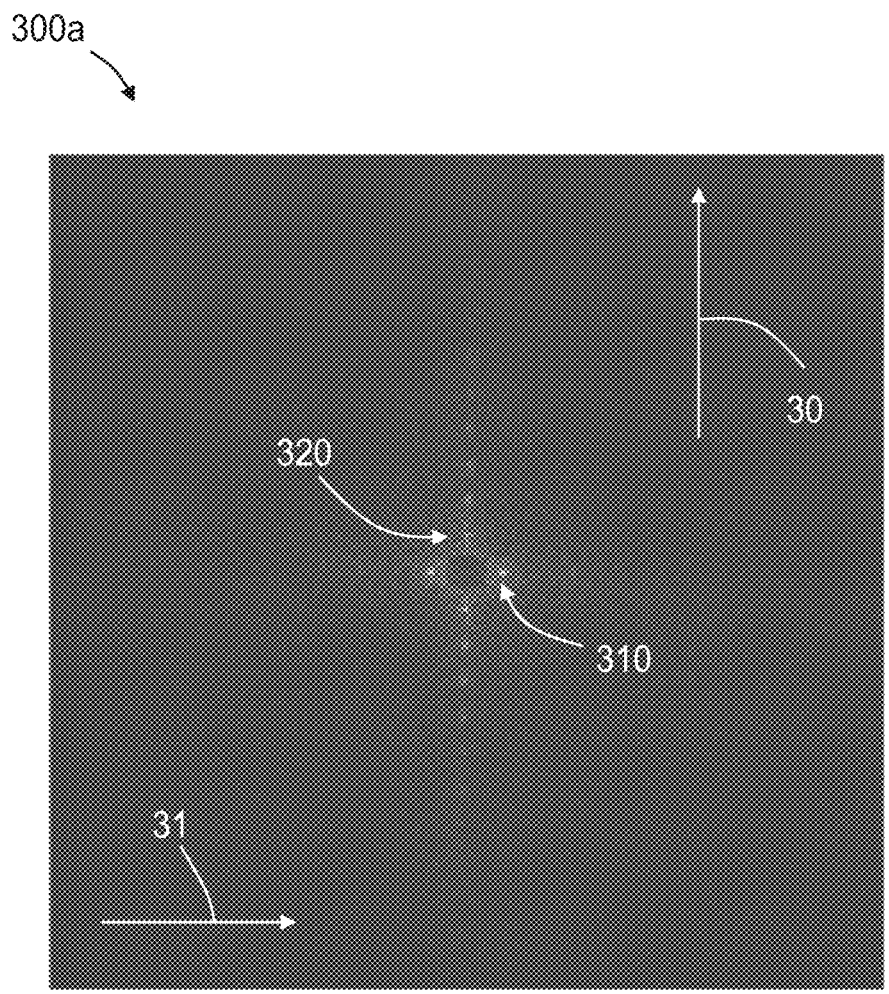
FIG. 4A is a plot of a magnitude of a Fourier transform of a height profile of a magnetically conductive layer.
Figure 4C:
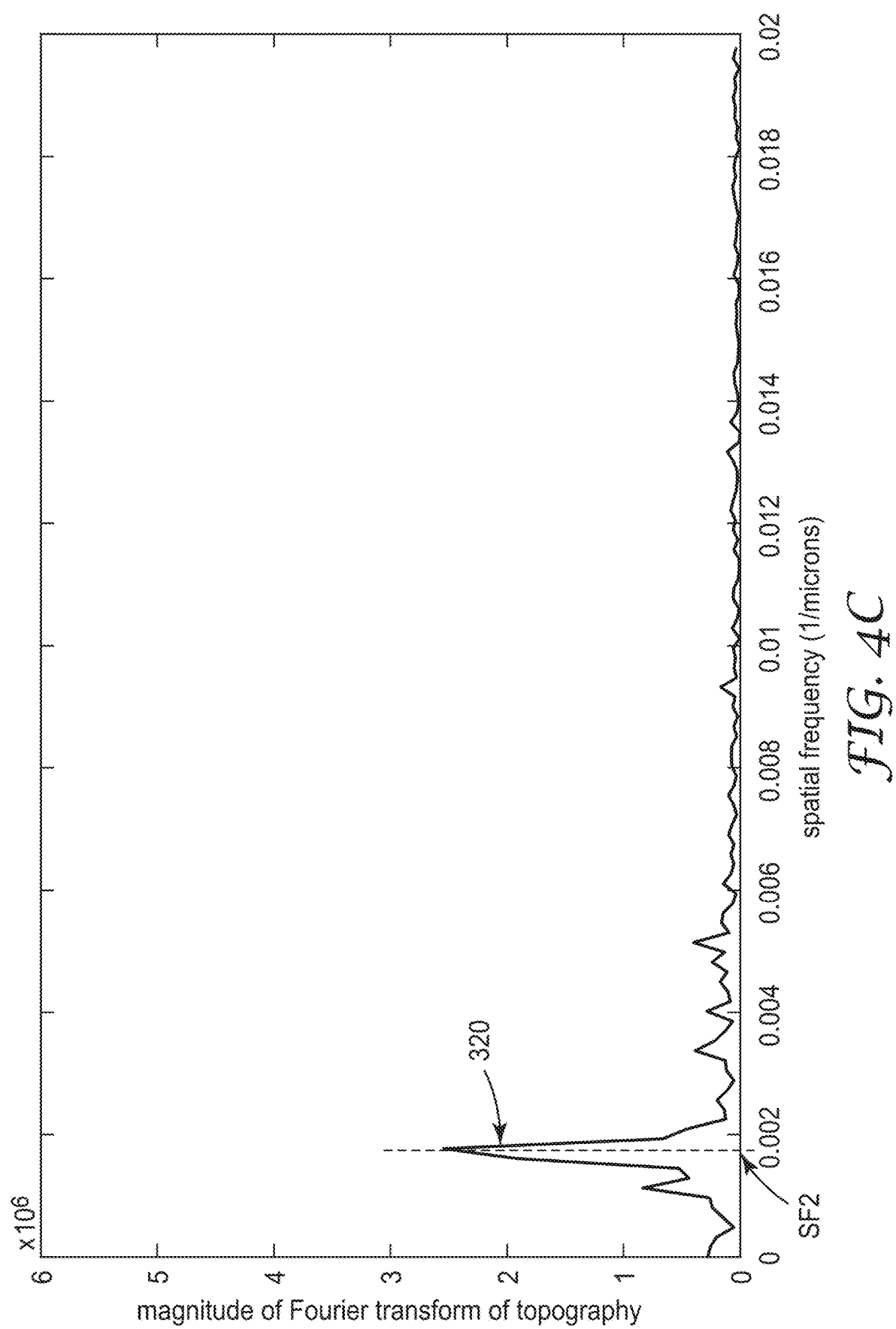
Figure 5A:
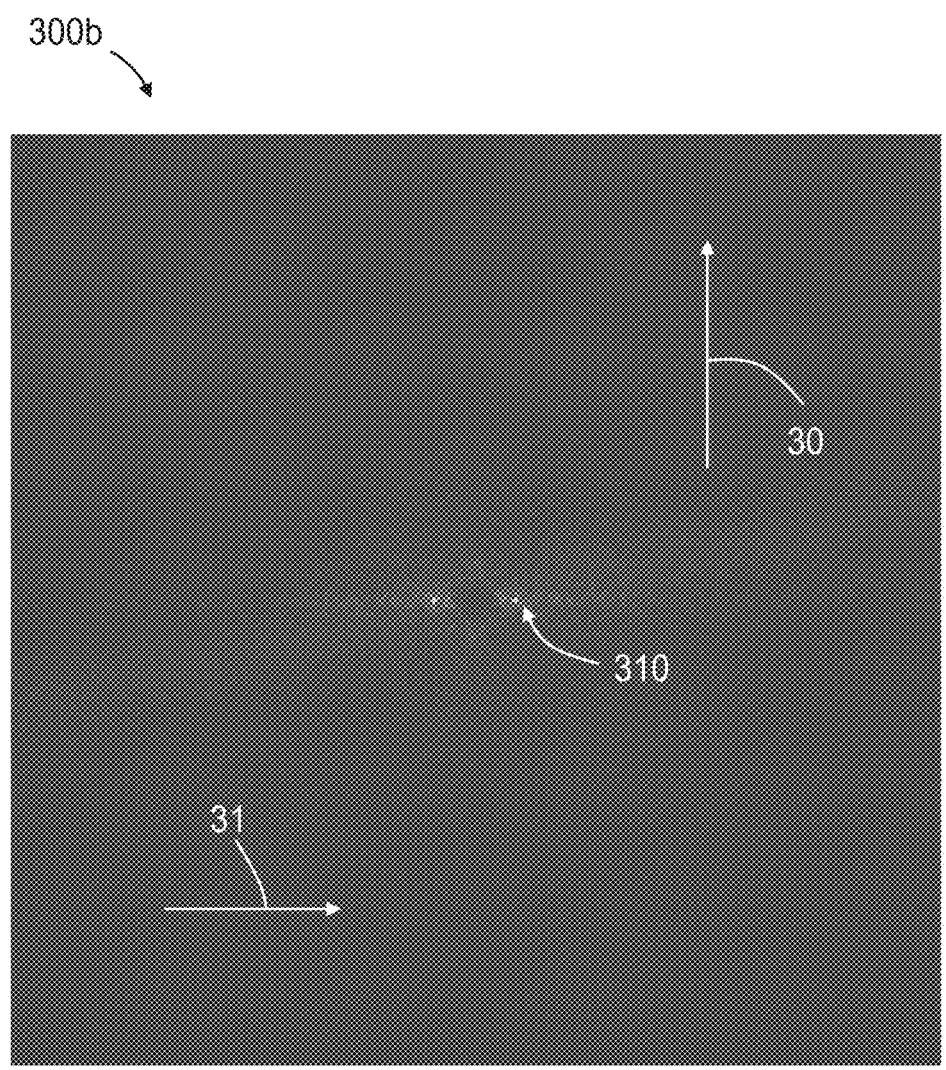
FIG. 5A is a plot of a magnitude of a Fourier transform of a height profile of another magnetically conductive layer.
Figure 5B:
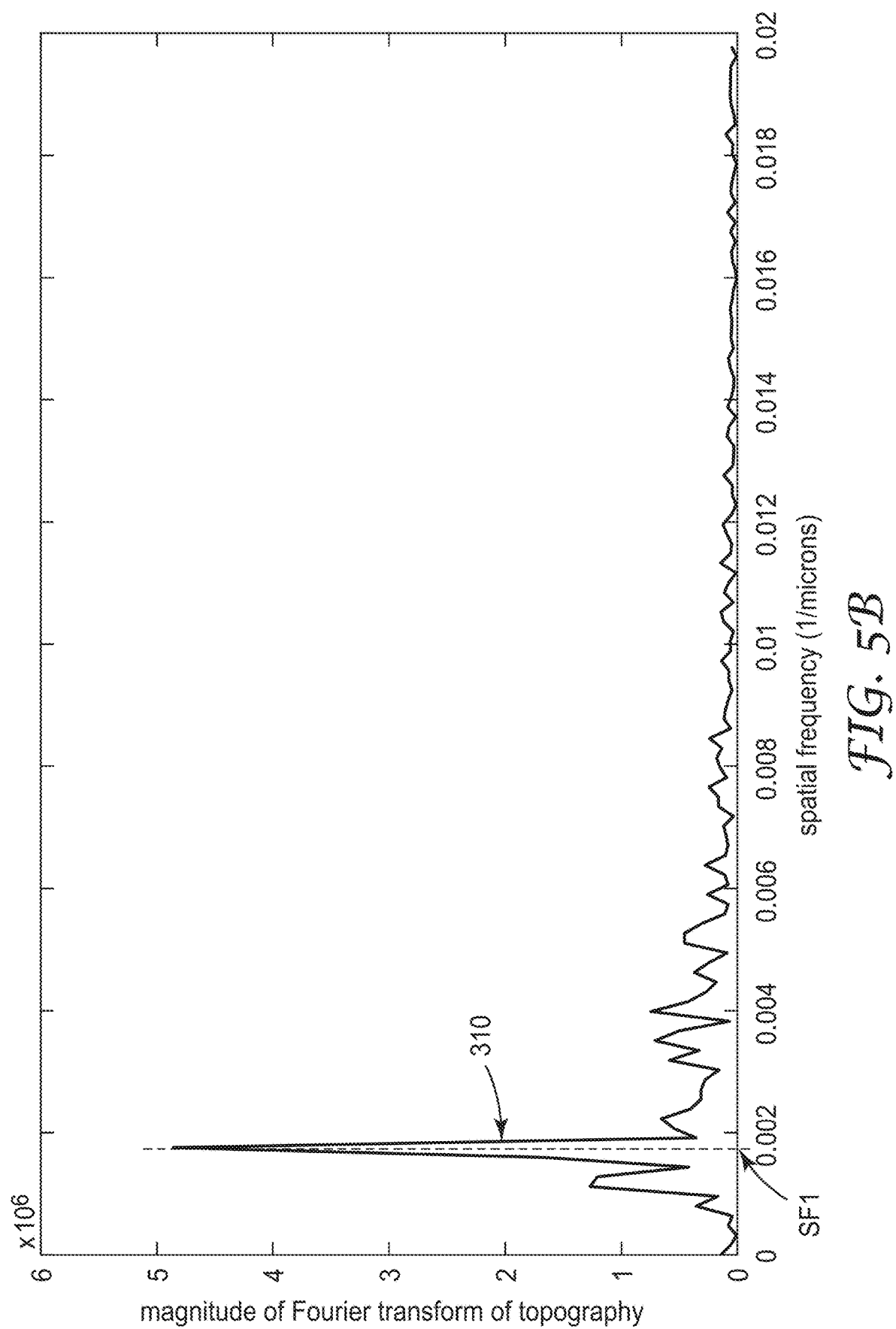
FIGS. 5B-5C are plots of the magnitude of the Fourier transform of FIG. 5A along different directions.
Figure 5C:
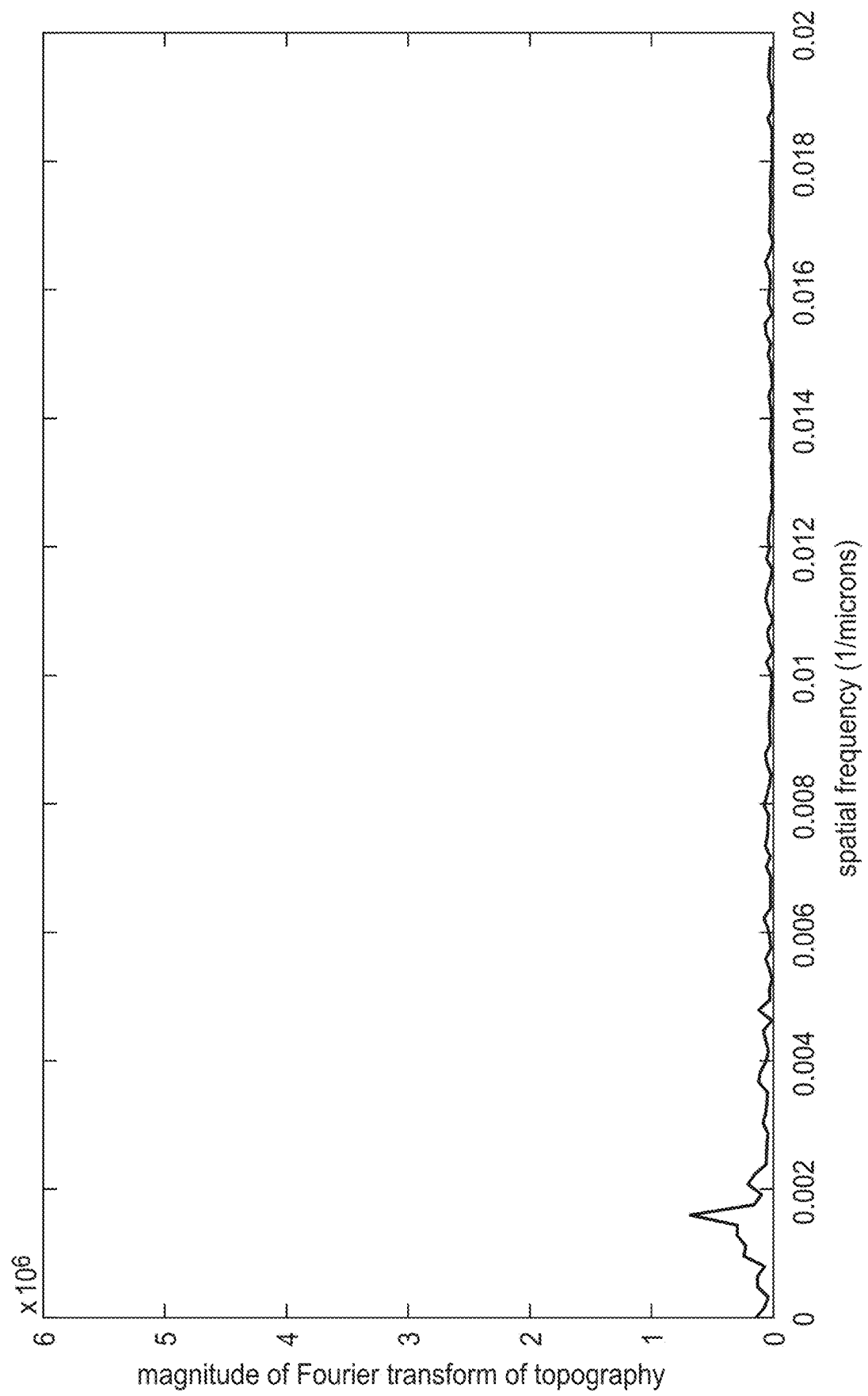

FIG. 1A is a schematic top plan view of a magnetic film 600 that includes one or more magnetically conductive layers 200 (one layer is shown in the embodiment illustrated in FIGS. 1A-1B). FIG. 1B is a schematic end view of the magnetic film 600. FIG. 1C is a schematic top plan view of another embodiment of the magnetic film 600. FIGS. 2A-2B are images of magnetically conductive layers 200a and 200b that were made from nanocrystalline iron alloy ribbons using cracking rollers as described elsewhere (see FIG. 11), where the images have been high-pass filtered to remove waviness of the layers. In some embodiments, each magnetically conductive layer 200 corresponds to magnetically conductive layer 200a or 200b. Each magnetically conductive layer 200 is cracked to form a plurality of first through-cracks 10 defining a plurality of magnetically conductive segments 20. FIG. 3 is a schematic contour plot of the magnitude of a Fourier transform 300 of regular patterns of through-cracks in a magnetically conductive layer 200 according to some embodiments. Fourier transform 300 can be determined by Fourier transforming the height profile (height of a major surface relative to an average height of the major surface) of the magnetically conductive layer 200. FIGS. 4A-4C show a magnitude of a Fourier transform 300a of a height profile of magnetically conductive layer 200a. The two-dimensional Fourier transform 300a is shown in FIG. 4A and the Fourier transform along second (31) and first (30) directions are shown in FIGS. 4B and 4C, respectively. FIGS. 5A-5C show a Fourier transform 300b of a height profile of magnetically conductive layer 200b. The two-dimensional Fourier transform 300b is shown in FIG. 5A and the Fourier transform along second (31) and first (30) directions are shown in FIGS. 5B and 5C, respectively. In FIG. 5C, there was no statistically significant peak in the Fourier transform corresponding to a pitch along the first direction. The height profiles were filtered to remove pits in the surface from the profile before calculating the Fourier transforms 300a and 300b.

A regular pattern may be a periodic pattern or may include some variation about periodicity, for example. In some embodiments, a pattern can be identified as a regular pattern by a peak in a Fourier transform of the pattern that corresponds to a pitch in the pattern.

In some embodiments, the first through-cracks 10 extend along a first direction 30 and form a first regular pattern along an orthogonal second direction 31 at a first pitch P1, such that a Fourier transform of the first regular pattern includes a first peak 310 along the second direction at a first spatial frequency SF1 corresponding to the first pitch P1 (e.g., the pitch P1 may be identified as the inverse of SF1). The first through-cracks have an average length L1 along the first direction. L1 divided by P1 can be greater than or equal to 5 (L1/P1≥5), for example. The pattern of the magnetically conductive segments 20 may continue further than illustrated in FIGS. 1A and 1C. For example, the array of segments 20 in the embodiment illustrated in FIG. 1C can optionally extend in the first direction 30 for more than two segments 20.

In some embodiments, each magnetically conductive layer is cracked to further form a plurality of second through-cracks 40 extending along the second direction 31 and forming a second regular pattern along the first direction at a second pitch P2, such that a Fourier transform 300 of the second regular pattern includes a second peak 320 along the first direction 30 at a second spatial frequency SF2 corresponding to the second pitch P2. The second through-cracks 40 have an average length L2 along the second direction 31. In some embodiments, L2/P2≤2 (see, e.g., FIG. 1C). In some embodiments, L2/P2≥2 (see, e.g., FIG. 1A). In some embodiments, in a top plan view, the first through-cracks 10 have an average width W1 along the second direction 31, and the second through-cracks 40 have an average width W2 along the first direction 30. W1 may be about equal to W2, or W1 may be greater than W2, or W1 may be less than W2. In some embodiments, the magnetic film is for use in an application where a magnetic field is along the first direction 30. In some such embodiments, it may be preferred that W1>W2. Having a smaller W2 can increase the magnetic flux along the first direction 30 while having a larger W1 can reduce eddy current losses. In some embodiments, W1/W2>1.1, or W1/W2>1.3, or 10>W1/W2>1.1, for example. In some embodiments, the average width is substantially smaller than the corresponding pitch. For example, in some embodiments, W1/P1 and/or W2/P2 is less than 0.3, or less than 0.2, or less than 0.1, or less than 0.05, or less than 0.03, or less than 0.01. In some embodiments, P2/P1>1.1, or P2/P1>1.3, or 10>P2/P1>1.1.

Figure 11:
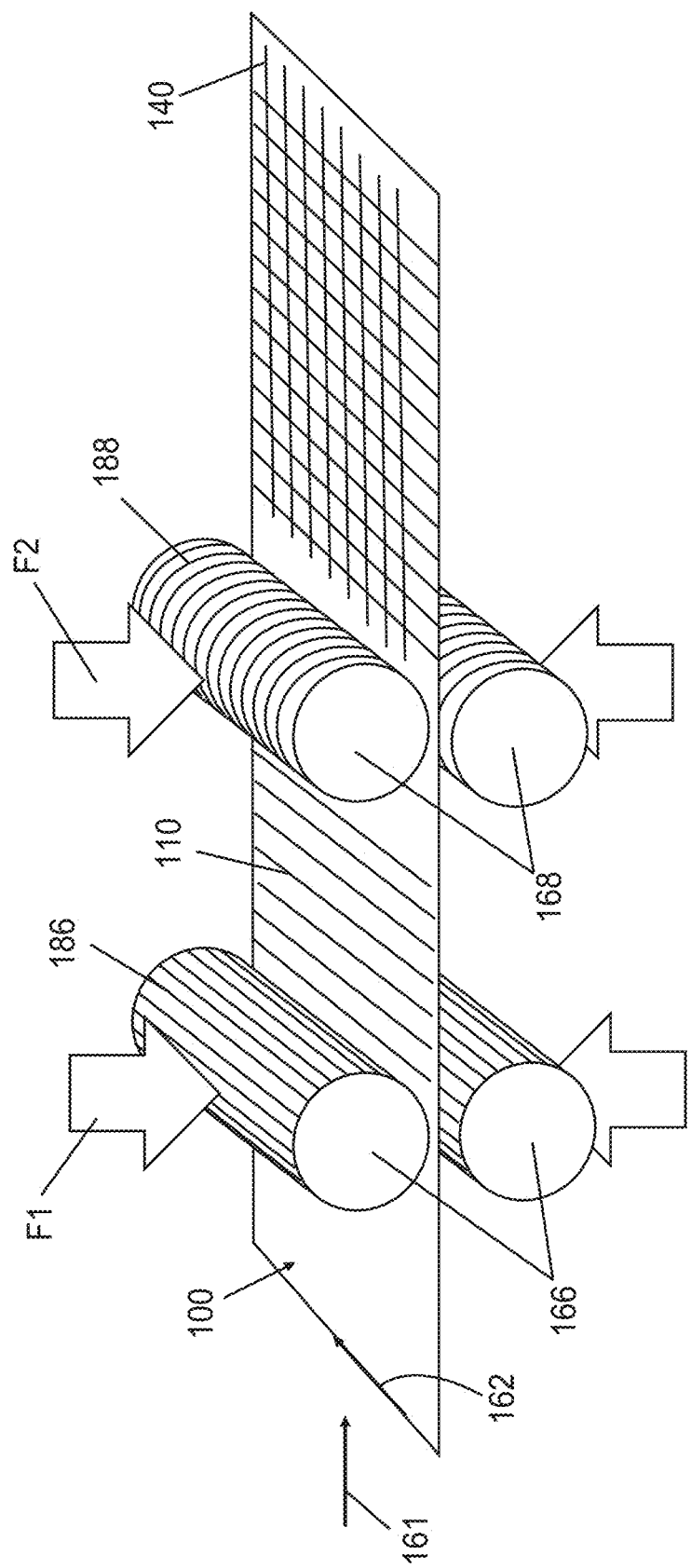
FIG. 11 is a schematic illustration of a method of cracking a magnetically conductive layer.

The widths W1 and W2 can be determined by the cracking process (e.g., using different widths of the elements 186 and 188 schematically illustrated in FIG. 11) or can be adjusted after the magnetically conductive layer is initially formed. For example, a magnetic film (or a magnetically conductive layer disposed on a substrate, for example) can be stretched asymmetrically (e.g., more in one in-plane direction than in an orthogonal in-plane direction, or only in one in-plane direction) by applying tension asymmetrically to the film. Then, while the film is under tension, a curable material (e.g., a curable adhesive composition and/or a curable polymer composition) can be coated onto the film such that the curable material at least partially fills at least a portion (e.g., all, or a portion spaced apart along a stretch direction) of the through-gaps. The curable material can then be cured (e.g., by applying actinic radiation or heat) so that when the tension is released, the widths of the through-gaps that were at least partially filled with the curable material remain approximately equal to the widths resulting from the asymmetric stretching. In some embodiments, the magnetically conductive layer is formed from an electrically conductive material (e.g., an iron alloy) and the curable material is electrically insulating to prevent electrical contact of adjacent segments of the electrically conductive material.

FIG. 3 schematically illustrates a constant magnitude contour 334 about first peak 310 and a constant magnitude contour 333 about second peaks 320. The two-dimensional Fourier transform 300 has a higher magnitude in the regions within the constant magnitude contours than in regions outside the constant magnitude contours. The contours 333 and/or 334 can be circular as schematically illustrated or can other shapes such as an oval shape, for example. The location and magnitudes of the peaks along the k1 and k2 (spatial frequencies along the second (31) and first (30) direction) axes can be the same or different.

In some embodiments, a magnetic film 600 includes one or more magnetically conductive layers 200, where each magnetically conductive layer 200 is cracked to form a plurality of through-cracks (10, 40) forming a regular pattern of through-cracks. The plurality of through-cracks includes a plurality of first through-cracks 10 extending along a first direction 30 and arranged along an orthogonal second direction 31 at a first pitch P1 such that a two-dimensional Fourier transform of the regular pattern of through-cracks includes a first peak along the second direction at a first spatial frequency corresponding to the first pitch P1. In some embodiments, the plurality of through-cracks (10, 40) further includes a plurality of second through-cracks 40 extending along the second direction 31 and arranged along the first direction 30 at a second pitch P2 such that the two-dimensional Fourier transform of the regular pattern of through-cracks includes a second peak 320 along the second direction 31 at a second spatial frequency corresponding to the second pitch P2. In some embodiments, the two-dimensional Fourier transform is free of any peak corresponding to a pitch of the regular pattern of through-cracks along the first direction.

The magnetically conductive layer 200a has pitches P1 and P2 that are approximately equal. The magnetically conductive layer 200b has a pitch P1 but does not have a pitch P2 with a corresponding peak in the Fourier transform that is discernable in FIGS. 2B and 5C. In some embodiments, P2/P1 is about 1, or greater than 1, or greater than 2, or greater than 5. In some embodiments, 1≤P2/P1≤12, or 1≤P2/P1≤10, or 2≤P2/P1≤9. In some embodiments, P1 is at least 50 micrometers, or at least 100 micrometers, or at least 200 micrometers, or at least 300 nm. In some embodiments, P1 is no more than 5 mm, or no more than 3 mm, or no more than 2 mm, or no more than 1 mm. For example, in some embodiments, P1 is in a range of 100 micrometers to 3 mm.

In some embodiments, the one or more magnetically conductive layers 200 are disposed on a substrate 50. In some embodiments, the substrate 50 is a polymeric film substrate.

Figure 6:
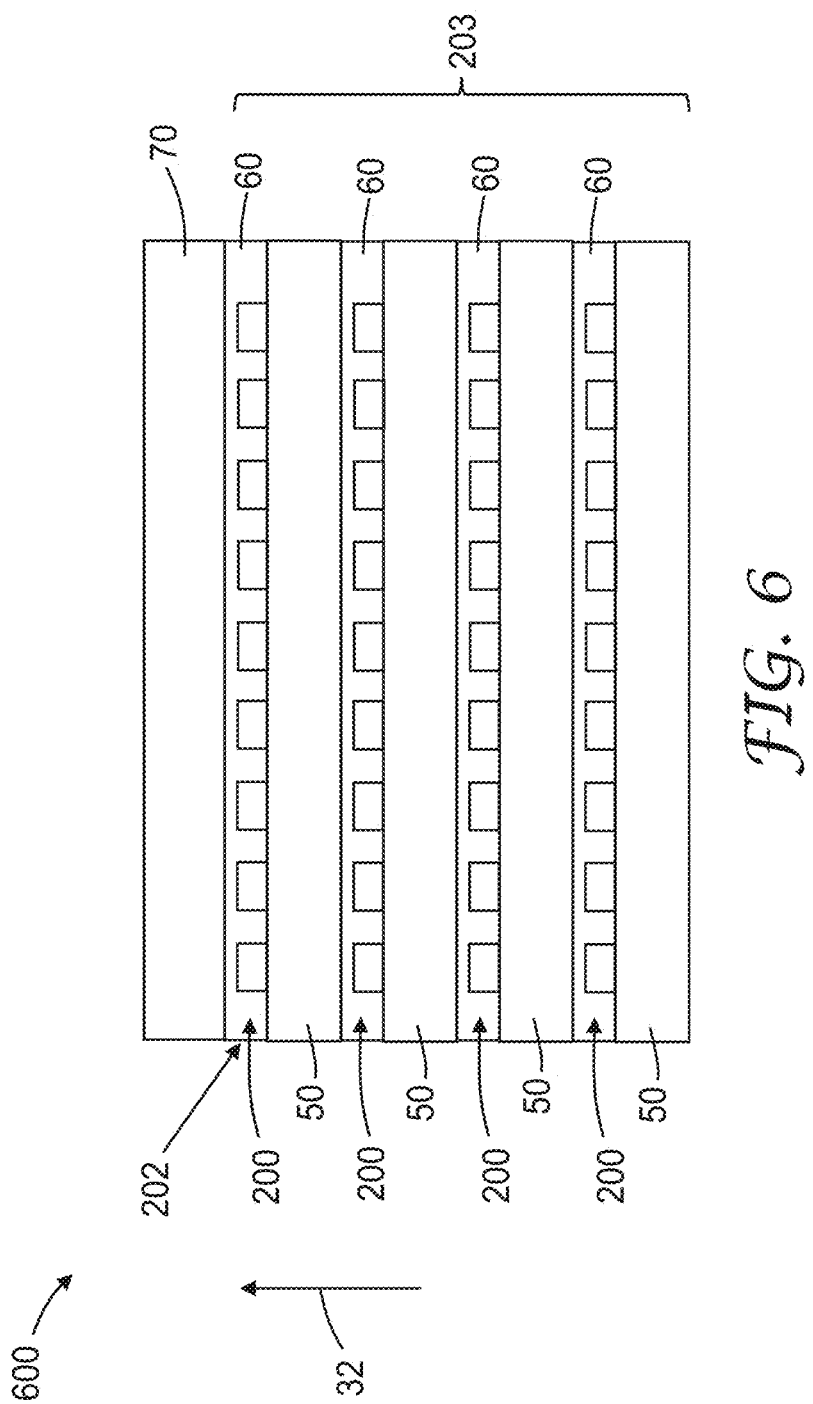
FIG. 6 is a schematic end view of a magnetic film including a plurality of magnetically conductive layers.

FIG. 6 is a schematic end view of an embodiment of a magnetic film 600 where the one or more magnetically conductive layers includes a plurality of magnetically conductive layers 200 stacked along a thickness direction 32 of the magnetic film 600. In some embodiments, the magnetic film includes a plurality of repeat units 203 stacked along a thickness direction 32 of the magnetic film 600, where each repeat unit includes a substrate 50; a magnetically conductive layer 200 from the one or more magnetically conductive layers disposed on the substrate 50; and an adhesive layer 60 disposed on the magnetically conductive layer and bonding the repeat unit to an adjacent repeat unit. The topmost (along the thickness direction 32) repeat unit 202 plurality of repeat units 203 is bonded to a repeat unit 70 (which may alternatively be a protective layer or a layer of an article adjacent the magnetic film 600) that is disposed on the plurality of repeat units 203.

Figure 7A:
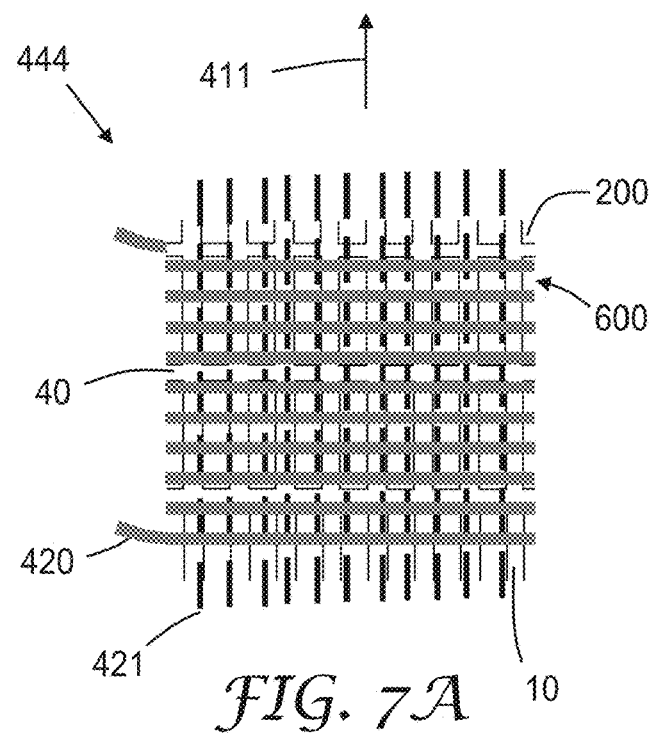
FIGS. 7A-7C are schematic top views illustrating different relative orientations of a magnetic film and a magnetic coil disposed proximate the magnetic film.
Figure 7B:
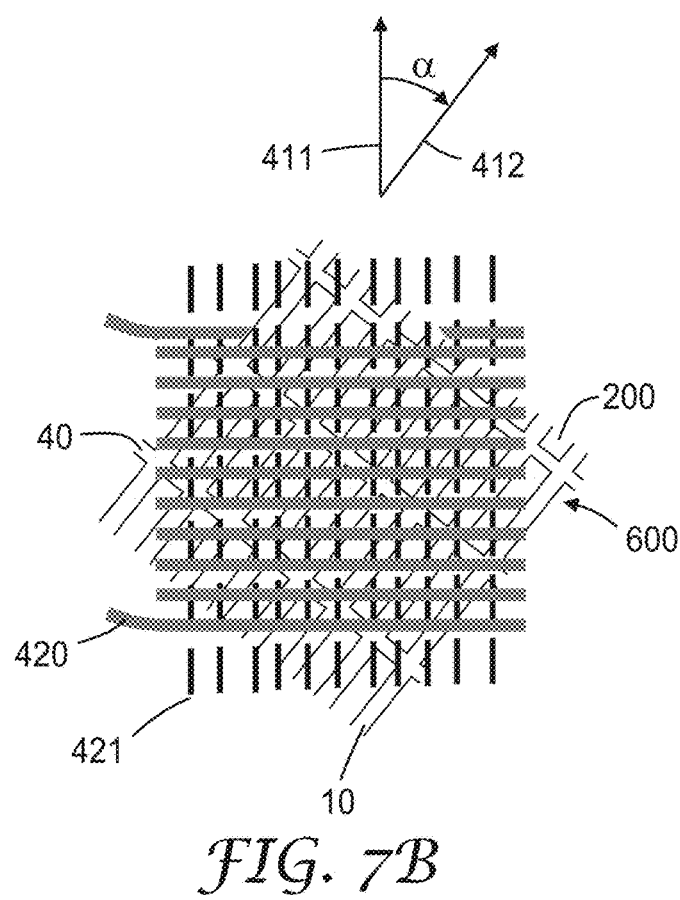
Figure 7C:
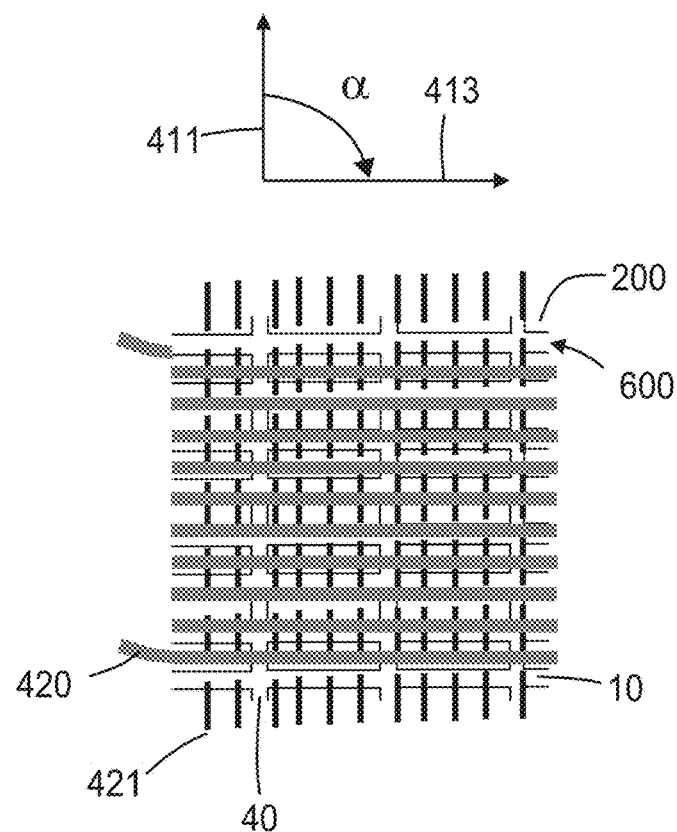

FIGS. 7A-7C are schematic top views showing different relative orientations of a magnetic film 600 and a magnetic coil 420 disposed proximate the magnetic film 600. An assembly 444 may be formed by disposing a magnetic coil 420 proximate the magnetic film 600 with the magnetic coil 420 generating magnetic flux lines 421 that traverse substantially parallel to, and extend across, at least a portion of the magnetic film 600. In some embodiments, a magnetic film 600 includes one or more magnetically conductive layers 200 where each magnetically conductive layer defines a plurality of through-cracks (10, 40) therein, such that when the magnetic film 600 is laid substantially flat and a magnetic coil 420 is disposed proximate the magnetic film 600 with the magnetic coil generating magnetic flux lines 421 that traverse substantially parallel to, and extend across, at least a portion of the magnetic film 600, the magnetic coil has a first inductance I1 at 200 kHz, and/or a first resistance R1 at 200 kHz, when the magnetic film 600 has a first in-plane orientation 411 (see FIG. 7A), and a second inductance I2 at 200 kHz, and/or a second resistance R2 at 200 kHz, when the magnetic film 600 is rotated in-plane relative to the magnetic coil by an angle α greater than about 15 degrees to have a second in-plane orientation 412 (see FIG. 7B), for example. In some embodiments, I1>I2. In some embodiments, R1>R2.

The inductance and resistance in the coil typically depend, at least in part, on the magnetically conductive material used in the magnetic film. In some embodiments, the magnetically conductive material is a nanocrystalline iron alloy, for example, which may have a relative permeability greater than 100, or greater than 500, or greater than 1000, or greater than 2000, for example. A higher relative permeability can result in a higher ratio of the inductance in the coil when proximate the magnetic film to the inductance in the coil when far from the magnetic film, for example. The ratios I1/I2 and/or R1/R2 typically depend, at least in part, on the anisotropy of the pattern of through-cracks in the magnetically conductive layer(s) of the magnetic film. A greater degree of anisotropy can result in a higher I1/I2 and/or R1/R2, for example.

In some embodiments, I1/I2≥1.1 when the magnetic film 600 is rotated in-plane relative to the magnetic coil 420 by about 20 degrees. In some embodiments, I1/I2≥1.2 when the magnetic film 600 is rotated in-plane relative to the magnetic coil 420 by about 30 degrees. In some embodiments, I1/I2≥1.3, or I1/I2≥1.4, or I1/I2≥1.5, when the magnetic film 600 is rotated in-plane relative to the magnetic coil 420 by about 45 degrees. In some embodiments, I1/I2≥1.5, or I1/I2≥1.6, or I1/I2≥1.7, when the magnetic film 600 is rotated in-plane relative to the magnetic coil 420 by about 60 degrees. In some embodiments, I1/I2≥2, or I1/I2≥2.1, or I1/I2≥2.2, when the magnetic film 600 is rotated in-plane relative to the magnetic coil 420 by about 90 degrees. FIG. 7C schematically illustrates the magnetic film 600 is rotated in-plane relative to the magnetic coil 420 by about 90 degrees so that the magnetic film 600 has an in-plane orientation 413. In some embodiments, I1 divided by a minimum (over angles α) of I2 is no more than 8 or no more than 5.

In some embodiments, the magnetic coil 420 has an inductance I at 200 kHz prior to being disposed proximate the magnetic film 600. In some embodiments, I1/I≥5, or I1/I≥7, or I1/I≥8, or I1/I≥9. I1/I can be up to 20 or up to 15, for example. In some embodiments, I2/I≥5, or I2/I≥7, or I2/I≥8.

In some embodiments, R1/R2≥1.1 when the magnetic film 600 is rotated in-plane relative to the magnetic coil 420 by about 20 degrees. In some embodiments, R1/R2≥1.2 when the magnetic film 600 is rotated in-plane relative to the magnetic coil 420 by about 30 degrees. In some embodiments, R1/R2≥1.5 when the magnetic film 600 is rotated in-plane relative to the magnetic coil 420 by about 45 degrees.

In some embodiments, R1/R2≥1.7 when the magnetic film 600 is rotated in-plane relative to the magnetic coil 420 by about 60 degrees. In some embodiments, R1/R2≥2.1, or R1/R2≥2.2, when the magnetic film 600 is rotated in-plane relative to the magnetic coil 420 by about 90 degrees. In some embodiments, R1 divided by a minimum (over angles α) of R2 is no more than 8 or no more than 5.

In some embodiments, the magnetic coil 420 has a resistance R at 200 kHz prior to being disposed proximate the magnetic film 600. In some embodiments, R1>R. In some embodiments, R1/R≥2.5, or R1/R≥2.8, or R1/R≥3, or R1/R≥3.2. In some embodiments, R1/R is no more than 10 or no more than 7. In some embodiments, R2>R. In some embodiments, R2/R≥2.5, or R2/R≥2.8.

The assembly 444 can be prepared by laying the magnetic film 600 substantially flat (e.g., nominally flat or approximately flat but with deviations from flatness due stress variations in the film, for example) and wrapping the magnetic film 600 with the wires of the magnetic coil 420 such that the wires are substantially parallel to the magnetic film 600 (e.g., most of the wires can be nominally or approximately parallel with a major surface of the magnetic film 600 but can have some deviation from parallel due to stiffness of the wires, for example). In some embodiments, the magnetic coil 420 is substantially planar and helically wrapped around the magnetic film 600. For example, magnetic coil 420 schematically illustrated in FIGS. 7A-7C may be substantially planar (e.g., extending substantially parallel to the magnetic film 600 on the top and bottom of the film) and may be wrapped helically around the magnetic film 600 along an axis parallel to orientation 411.

The inductance at 200 kHz, the resistance at 200 kHz, and the corresponding Q-factor are reported in the following table for the assembly 444 when the magnetic film 600 included a single magnetically conductive layer 200b (see FIG. 2B) The magnetic sheet had dimensions of 17 mm×38 mm×40 micrometers. The magnetic film including substrate and adhesive had a thickness of 60 micrometers.

| α (Degrees) | Inductance (µH) | Resistance (Ohm) | Q-factor |
|---|---|---|---|
| 0 | 65.835 | 9.96 | 8.3 |
| 10 | 62.993 | 9.71 | 8.2 |
| 20 | 57.094 | 8.59 | 8.4 |
| 30 | 50.392 | 7.48 | 8.5 |
| 45 | 42.053 | 6.21 | 8.5 |
| 60 | 37.356 | 5.50 | 8.5 |
| 90 | 28.562 | 4.23 | 8.5 |

In some embodiments, a magnetic film 600 includes one or more magnetically conductive layers 200 defining a plurality of through-cracks (10, 40) therein, such that when the magnetic film is laid substantially flat and a magnetic coil 420 is disposed proximate the magnetic film with the magnetic coil generating magnetic flux lines 421 at 200 kHz that traverse substantially parallel to, and extend across, at least a portion of the magnetic film, the magnetic coil has maximum inductance Imax when the magnetic film has a first in-plane orientation 411, and a minimum inductance Imin when the magnetic film is rotated in-plane relative to the magnetic coil to have a different second in-plane orientation (412 or 413). In some embodiments, Imax/Imin>1.5. In some embodiments, Imax/Imin>1.8. In some embodiments, Imax/Imin>2. Imax/Imin can be up to 8 or up to 5, for example. In some embodiments, the second in-plane orientation is rotated in-plane relative to the first in-plane orientation by about 90 degrees.

Figure 8A:
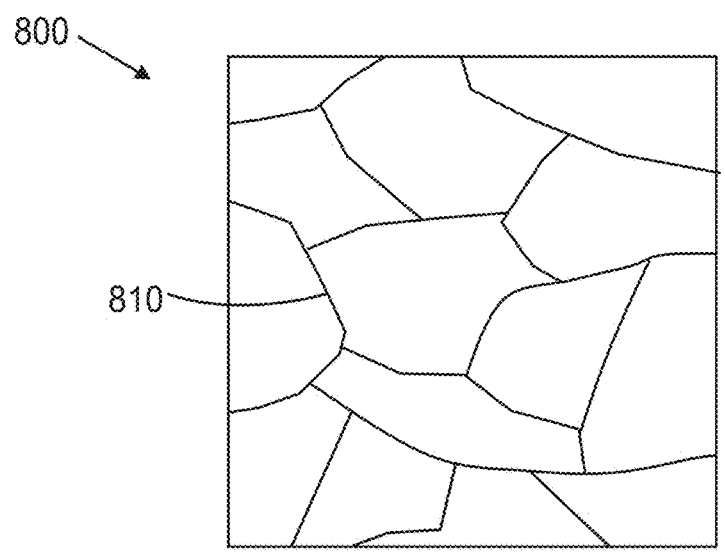
FIG. 8A is a schematic top view of a magnetic film including an irregular pattern of through-cracks.
Figure 8B:
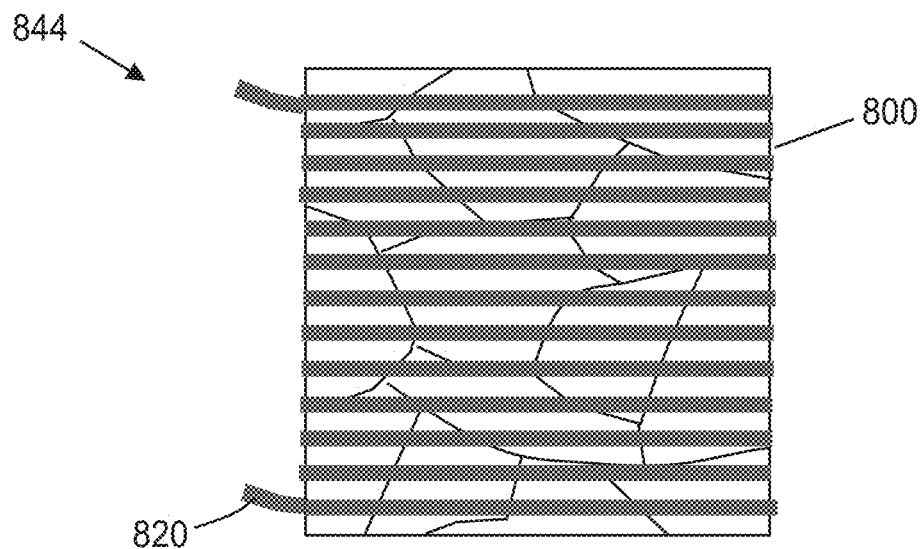
FIG. 8B is a schematic top view of an assembly formed by disposing a magnetic coil proximate the magnetic film of FIG. 8A.
Figure 8C:
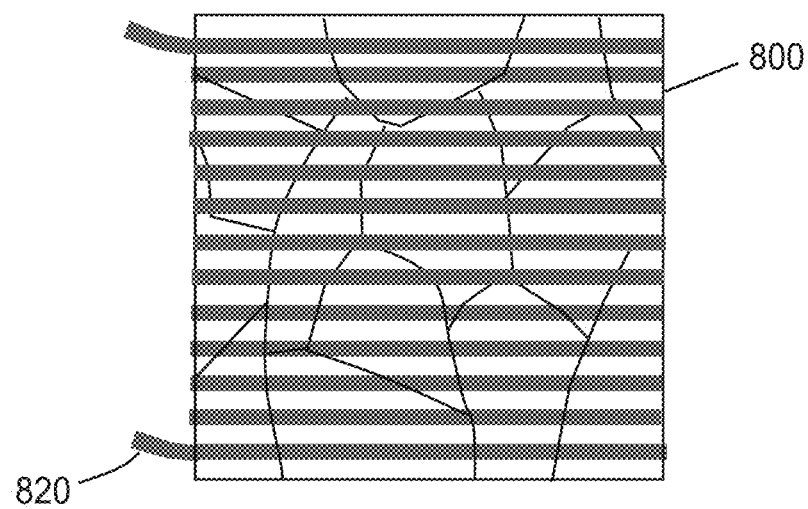
FIG. 8C is a schematic top view of the assembly of FIG. 8B after the magnetic film 800 has been rotated in-plane relative to the magnetic coil by about 90 degrees.

FIG. 8A is a schematic top view of a magnetic film 800 including one or more conductive layers cracked to form a plurality of first through-cracks 810 forming an irregular pattern. The magnetic film 800 may correspond to magnetic film 600, or other magnetic films described elsewhere herein having a regular pattern of through-cracks, except that the regular pattern of through-cracks have been replaced with an irregular pattern of through-cracks. The irregular pattern of through-cracks may have a same average gap and percent area coverage as a corresponding regular pattern of through-cracks, for example. FIG. 8B is a schematic top view of an assembly 844 formed by disposing a magnetic coil 820 proximate the magnetic film 800. FIG. 8C is a schematic top view of the assembly when the magnetic film 800 is rotated in-plane relative to the magnetic coil 820 by about 90 degrees.

In some embodiments, a magnetic film 600 includes one or more magnetically conductive layers 200 cracked to form a plurality of through-cracks (10, 40) forming a regular pattern, such that when the magnetic film is laid substantially flat and an assembly 444 is formed by disposing a magnetic coil 420 proximate the magnetic film 600 with the magnetic coil generating magnetic flux lines 421 that traverse substantially parallel to, and extend across, at least a portion of the magnetic film 600, the magnetic coil 420 has an inductance that is greater than an inductance of a comparative assembly 844 that has a same construction except that the one or more conductive layers of the magnetic film 800 of the comparative assembly 844 are cracked to form a plurality of first through-cracks 810 forming an irregular pattern. The magnetic coil 420 may have an inductance that is greater than the inductance of the comparative assembly 844 even when the number of turns in the magnetic coil 820 in the comparative assembly is increased by about 30%. The inductance of the comparative assembly 844 is the inductance of the magnetic coil 820 in the comparative assembly. In some embodiment, the magnetic coil of the assembly 444 has a first inductance I1 at 200 kHz and a second inductance I2 at 200 kHz when the magnetic film of the assembly 444 is rotated in-plane relative to the magnetic coil of the assembly 444 by about 90 degrees, where I1/I2≥2, or I1/I2≥2.1, or I1/I2≥2.2. In some such embodiments, or in other embodiments, the magnetic coil 820 of the comparative assembly 844 has a first inductance Ic1 at 200 kHz and a second inductance Ic2 at 200 kHz when the magnetic film 800 of the comparative assembly 844 is rotated in-plane relative to the magnetic coil 820 of the comparative assembly 844 by about 90 degrees, where Ic1 and Ic2 are approximately equal (e.g., equal to within 20 percent, or within 10 percent).

An assembly corresponding to assembly 444 was prepared using a magnetic film having a two magnetically conductive layers 200b (see FIG. 2A) and a comparative assembly corresponding to comparative assembly 844 was prepared using a magnetic film having magnetically conductive layers prepared by cracking a nanocrystalline iron alloy ribbon (same type of ribbon used for magnetically conductive layer 200b) in an irregular pattern resembling a randomized square pattern. The magnetic films used in the assembly had in-plane dimensions of 13 mm×66 mm and were 60 micrometers thick including the thicknesses of substrate and adhesive layers where the two magnetically conductive layers had a thickness of 20 micrometers each. Each of the films had a relative permeability of 3000. The magnetic coil used a flat wire 0.04 mm thick and 0.6 mm wide. The resistance and inductance of the magnetic coil were measured at 200 kHz and the results are reported in the following table.

| | Comparative Assembly | | Assembly | |
|---|---|---|---|---|
| Number of Turns | Resistance (Ohms) | Inductance (μH) | Resistance (Ohms) | Inductance (μH) |
| 60 | 14 | 78 | 20 | 106 |
| 90 | 17 | 98 | 37 | 178 |

The first through-crack 10 and the second through-cracks 40 may extend along orthogonal directions as schematically illustrated in FIG. 1A, for example, or may extend along directions making an oblique angle with one another.

Figure 9A:
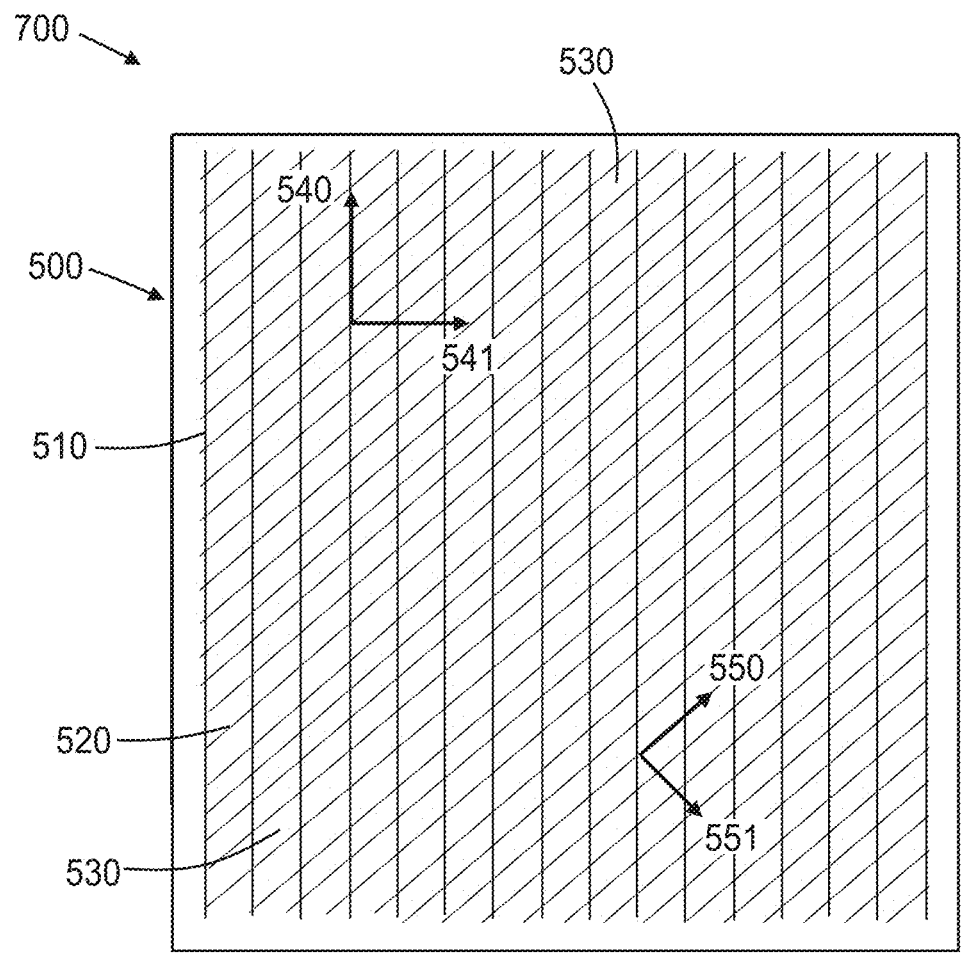
FIG. 9A is a schematic top plan view of a magnetic film including a magnetically conductive layer.
Figure 9B:
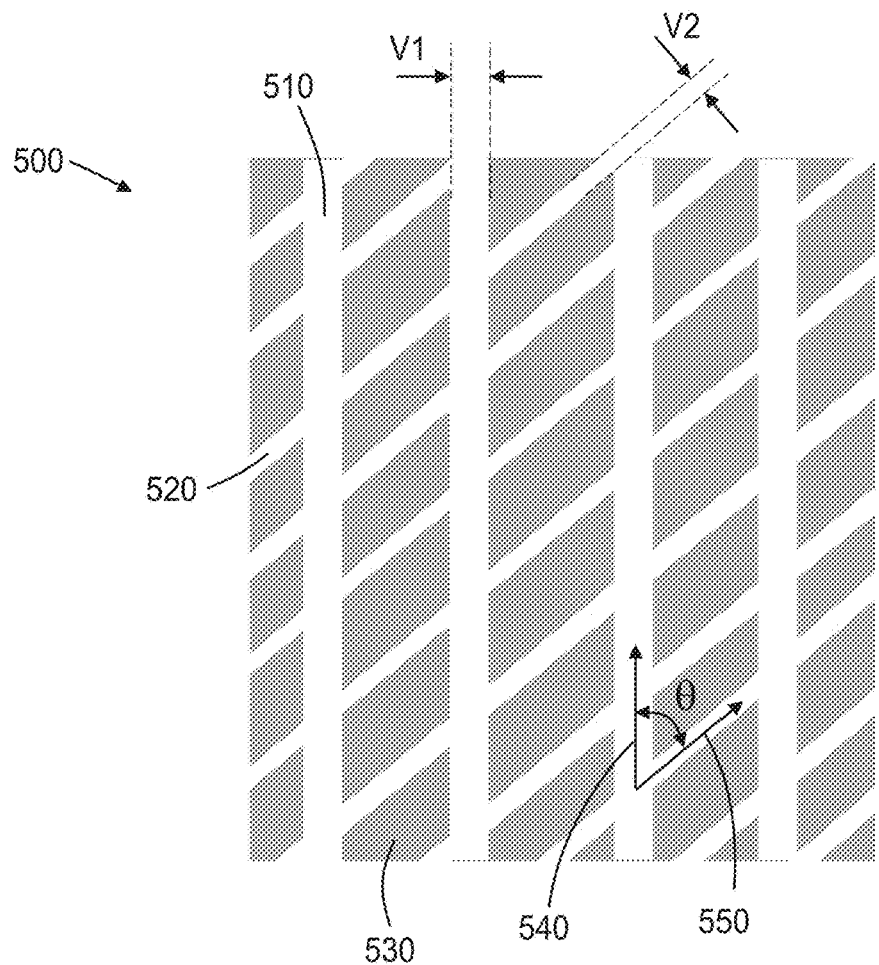
FIG. 9B is a schematic top plan view of the magnetically conductive layer of FIG. 9A.

FIGS. 9A-9B are schematic top plan views of a magnetic film 700 and a magnetically conductive layer 500. The magnetic film 700 includes one or more magnetically conductive layers 500 cracked to form pluralities of at least first and second through-cracks 510 and 520 defining a plurality of magnetically conductive segments 530. In some embodiments, the one or more magnetically conductive layers 500 includes two (or more) magnetically conductive layers. The first through-cracks 510 extend along a first direction 540 and form a first regular pattern along an orthogonal second direction 541, and the second through-cracks 520 extend along a third direction 550, different than the first direction, and form a second regular pattern along an orthogonal fourth direction 551 such that a two-dimensional Fourier transform 300 of the first and second regular patterns include respective first 310 and second 320 peaks along the respective second and fourth directions 541 and 551. In some embodiments, in a top plan view, the first through-cracks 510 have an average width V1 along the second direction, and the second through-cracks 520 have an average width V2 along the fourth direction, where V1>V2. Magnetic film 700 may have any of the properties described for assembly 444 when the magnetic film 700 is laid substantially flat and a magnetic coil 420 is disposed proximate the magnetic film 700 with the magnetic coil 420 generating magnetic flux lines 421 that traverse substantially parallel to, and extend across, at least a portion of the magnetic film 700. The length scales (e.g., pitch, through-crack length, through-crack width) of magnetic film 700 may be in any range described for the corresponding length scale of magnetic film 600. For example, in some embodiments, V1/V2>1.1, or V1/V2>1.3, or 10>V1/V2>1.1.

In some embodiments, the first direction 540 and the third direction 550 define an oblique angle θ therebetween. In some embodiments, the first direction 540 and the third direction 550 are substantially orthogonal (e.g., within 20 degrees, or 10 degrees, or even 5 degrees of orthogonal).

Figure 10:
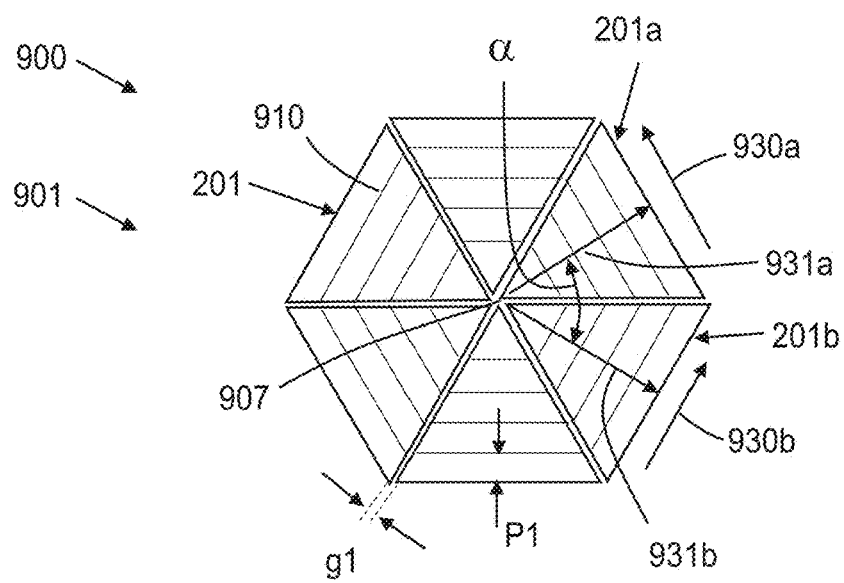
FIG. 10 is a schematic top view of a magnetic film including a first magnetically conductive layer that includes a plurality of discrete sections.

FIG. 10 is a schematic top view of a magnetic film 900 including a first magnetically conductive layer 901 including a plurality of discrete sections 201. Each section 201 is cracked to form a plurality of through-cracks 910 extending along a first direction (930a, 930b) and forming a regular pattern along an orthogonal second direction (931a, 931b) at a first pitch P1 such that a Fourier transform 300 of the regular pattern includes a peak 310 along the second direction at a spatial frequency corresponding to the first pitch P1. The second direction 931a for at least one section 201a in the plurality of discrete sections 201 is different from the second direction 931b for at least one other section 201b in the plurality of discrete sections 201. Different directions refer to non-parallel directions. In some embodiments, the second direction 931a for at least one section 201a in the plurality of discrete sections 201 forms an oblique angle α with the second direction 931b for at least one other section 201b in the plurality of discrete sections 201. In some embodiments, the second direction (931a, 931b) for each section in the plurality of discrete sections 201 is substantially along a radial direction from a center 907 of the first magnetically conductive layer 901 (e.g., the second direction (931a, 931b) for each section in the plurality of discrete sections 201 can be nominally along the radial direction from the center 907 but may differ from the radial direction due to ordinary manufacturing variations, or the second directions can differ from the radial direction due to small displacements or rotations (e.g., due to manufacturing variations) of the discrete sections 201 from positions and orientations that result in the second direction being radial). The magnetic film 900 can be useful in applications where magnetic flux lines extend primarily along a radial direction (e.g., produced by a planar spiral coil), for example.

In some embodiments, adjacent sections in the plurality of discrete sections are separated by a gap. In some embodiments, the gaps have an average width g1 which may be larger than an average width of the through-cracks 910. The average gap g1 may correspond to the average width W1 or V1, for example, and average width of the through-cracks 910 may correspond to the average width W2 or V2, for example. The length scales (e.g., pitch, through-crack length, through-crack width) or ratio of length scales of magnetic film 900 may be in any range described for the corresponding length scale or ratio of length scales of magnetic film 600, for example.

In some embodiments, the magnetic film 900 further includes a second magnetically conductive layer (e.g., corresponding to one of the layers 200 depicted in FIG. 6) proximate the first magnetically conductive layer (e.g., corresponding to another one of the layers 200 depicted in FIG. 6). In some embodiments, the second magnetically conductive layer includes a plurality of discrete sections, each section of the second magnetically conductive layer cracked to form a plurality of regularly arranged through-cracks. In some embodiments, the second magnetically conductive layer is a second layer of the magnetically conductive layer 901.

The magnetic film 900 can be made, for example, by making a first magnetic film having through-cracks extending along a first direction and forming a regular pattern along an orthogonal second direction, cutting sections 201 from the first magnetic film, and then placing the sections 201 in a pattern as schematically illustrated in FIG. 10 (e.g., the sections can be placed on and bonded to a substrate) to provide the magnetic film 900. The plurality of sections 201 can include 3 to 20 or 4 to 16 sections, for example. Each section may have a substantially same size and shape, or different sections may have different sizes and/or shapes (e.g., the sections may span different angles near the center 907).

In some embodiments, a magnetically conductive layer is intentionally cracked to form a regular pattern of through-cracks. In some embodiments, a magnetically conductive layer is cracked using cracking rollers as schematically illustrated in FIG. 11. A magnetically conductive layer 100 is moved along a down web or machine direction 161 between a first pair of cracking rollers 166 and a second pair of cracking rollers 168. The cracking rollers 166 include a plurality of linear elements 186 (e.g., wires or ridges disposed on the roller) extending along an across web or transverse direction 162 orthogonal to the machine direction 161. A force per unit length along the transverse direction F1 is applied to the first pair of cracking rollers 166 which results in the plurality of first through-cracks 110 being formed. The plurality of first through-cracks 110 extend along the transverse direction. The cracking rollers 168 include a plurality of elements 188 (e.g., wires or ridges disposed on the roller) extending around a circumference of the rollers. A force per unit length along the transverse direction F2 is applied to the second pair of cracking rollers 168 which results in the plurality of second through-cracks 140 being formed. The plurality of second through-cracks 140 extend along the machine direction 161. The forces per unit length F1 and F2 can be the same or different. The spacing (pitch) between the linear elements 186 can be the same or different from the spacing (pitch) between the elements 188. For example, magnetically conductive layer 200a was cracked using rollers with approximately equal spacing between the elements of the sets of rollers and magnetically conductive layer 200b was cracked with the spacing of the elements of one set of rollers about 9 times the spacing of the elements of the other set of rollers. In some embodiments, the pairs of rollers 166 and 178 may be rotated relative to each other, for example, to form other crack patterns.

Figure 12:
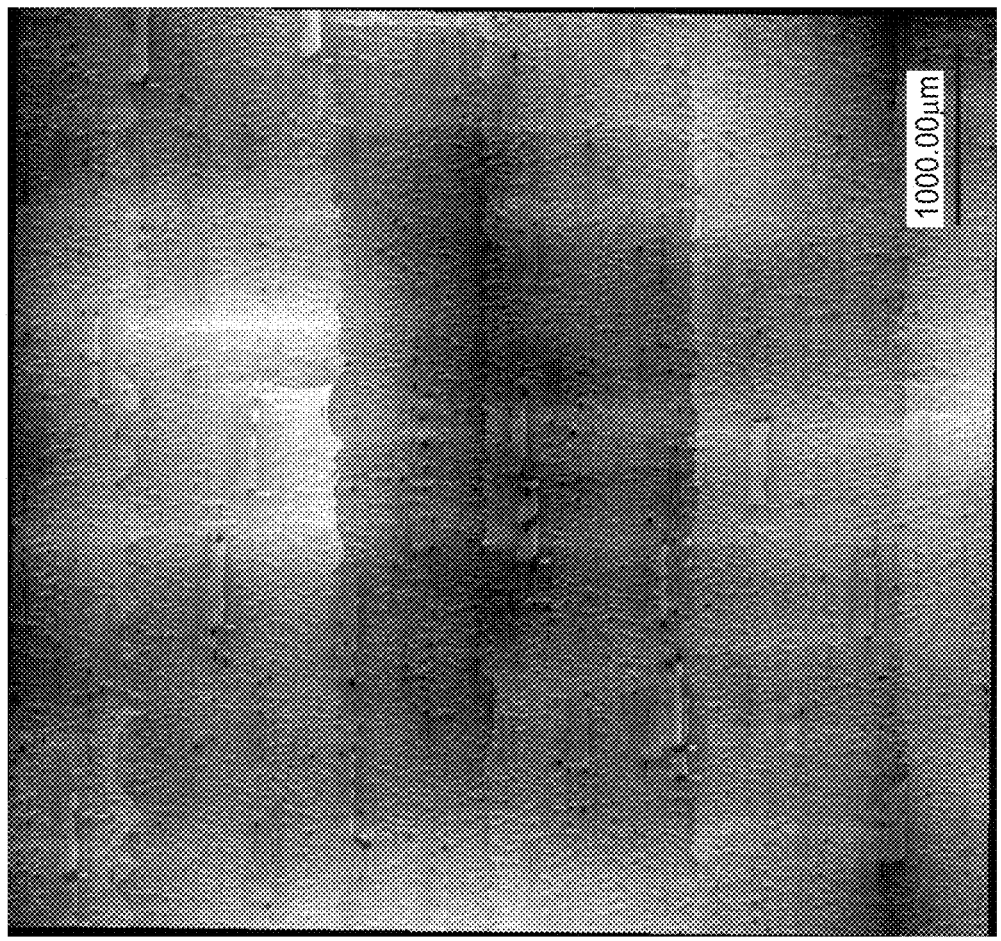
FIG. 12 is an image of a magnetically conductive layer.
Figure 12:
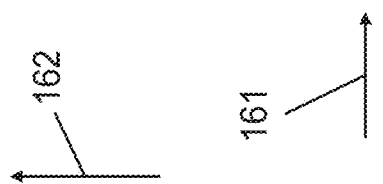
Figure 13A:
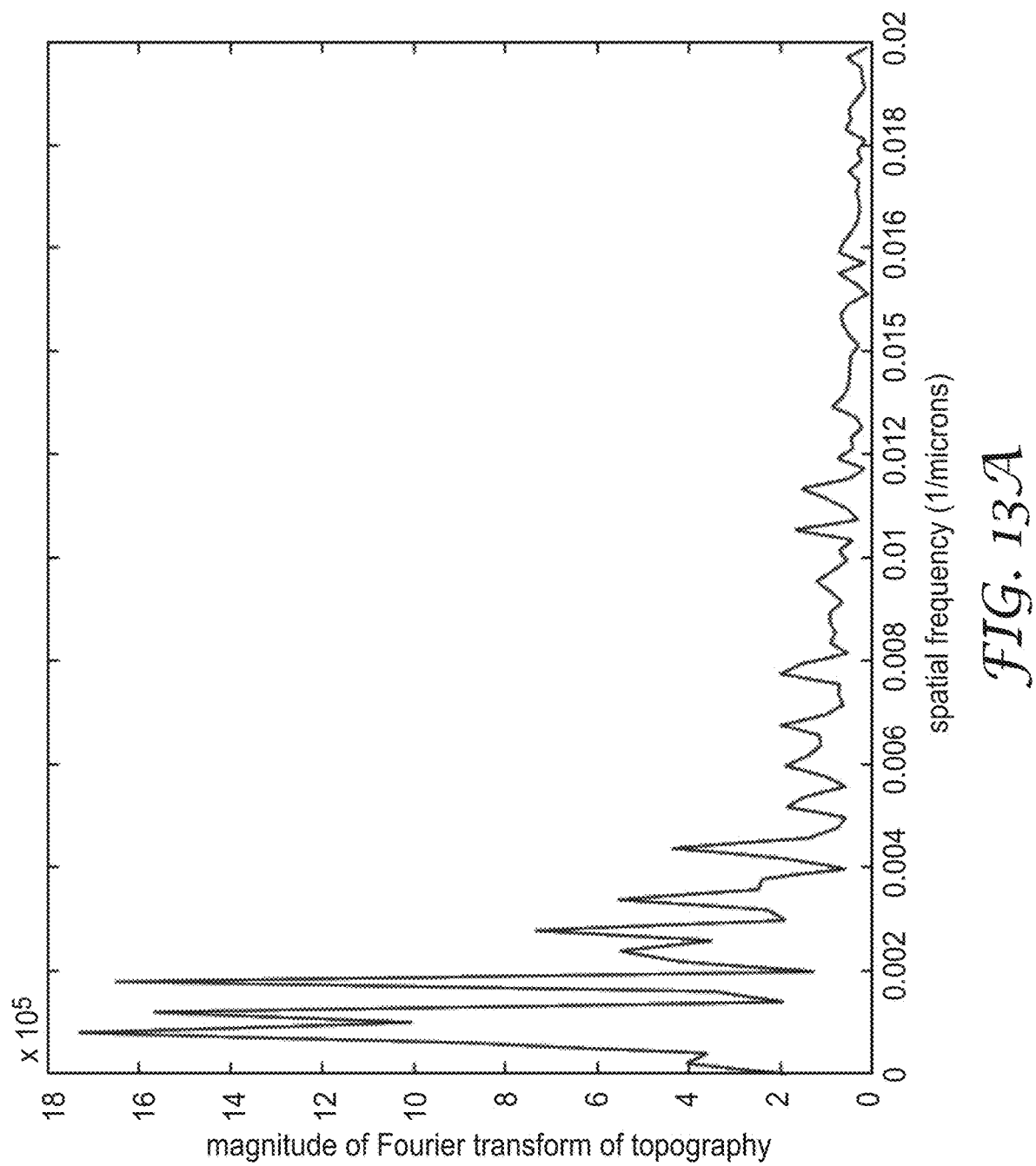

Additional samples of a nanocrystalline ribbon having a relative permeability of 3000 were cracked using the system schematically illustrated in FIG. 11. The ratio of the spacing of the elements 188 to the spacing of the elements 186 was about 7:3. An image of the cracked sample is shown in FIG. 12. The sample was mounted on a cylinder with an approximately 3 inch radius so that the curvature was along the direction 161 in order to more clearly show the gaps extending along the direction 162. Magnitudes of Fourier transforms of the height profiles (after subtracting the curvature) are shown in FIGS. 13A-13B along the directions 161 and 162, respectively. The maximum peak in FIG. 13A was at a spatial frequency of 0.000796 inverse micrometers and the maximum peak in FIG. 13B was at a spatial frequency of 0.00159 inverse micrometers. The maximum peaks had similar magnitudes of about $1.7\text{-}1.9 \times 10^6$.

Other methods of forming a regular pattern of through-cracks include imparting a stress relief pattern to the magnetically conductive layer prior to cracking the layer. For example, the magnetically conductive layer may be scored in a regular pattern such as a rectangular, square, or triangular pattern. The score lines can be formed by pressing a sharp blade into the film, for example, or by cutting into the layer using a laser, for example. In some embodiments, the magnetically conductive layer is laminated to a substrate (e.g., a polymeric film), a regular stress-relief pattern is applied to the magnetically conductive layer, and then the magnetically conductive layer is cracked in a pattern determined by the stress-relief pattern (e.g., along score lines). The magnetically conductive layer can then be cracked by flexing the film using roller(s), for example.

The present description includes the following illustrative embodiments.

A first embodiment is a magnetic film comprising one or more magnetically conductive layers, each magnetically conductive layer cracked to form a plurality of first through-cracks defining a plurality of magnetically conductive segments, the first through-cracks extending along a first direction and forming a first regular pattern along an orthogonal second direction at a first pitch P1, such that a Fourier transform of the first regular pattern comprises a first peak along the second direction at a first spatial frequency corresponding to the first pitch P1, the first through-cracks having an average length L1 along the first direction, $L1/P1 \geq 5$.

A second embodiment is the magnetic film of the first embodiment, wherein each magnetically conductive layer is cracked to further form a plurality of second through-cracks extending along the second direction and forming a second regular pattern along the first direction at a second pitch P2, such that a Fourier transform of the second regular pattern comprises a second peak along the second direction at a second spatial frequency corresponding to the second pitch P2.

A third embodiment is the magnetic film of the second embodiment, wherein in a top plan view, the first through-cracks have an average width W1 along the second direction, and the second through-cracks have an average width W2 along the first direction, W1>W2.

A fourth embodiment is the magnetic film of any one of the first through third embodiments, wherein the one or more magnetically conductive layers are disposed on a substrate.

A fifth embodiment is the magnetic film of any one of the first through fourth embodiments, wherein the one or more magnetically conductive layers comprises a plurality magnetically conductive layers stacked along a thickness direction of the magnetic film.

A sixth embodiment is a magnetic film comprising one or more magnetically conductive layers, each magnetically conductive layer defining a plurality of through-cracks therein, such that when the magnetic film is laid substantially flat and a magnetic coil is disposed proximate the magnetic film with the magnetic coil generating magnetic flux lines that traverse substantially parallel to, and extend across, at least a portion of the magnetic film, the magnetic coil has a first inductance I1 at 200 kHz when the magnetic film has a first in-plane orientation, and a second inductance I2 at 200 kHz when the magnetic film is rotated in-plane relative to the magnetic coil by an angle greater than about 15 degrees to have a second in-plane orientation, I1>I2.

A seventh embodiment is the magnetic film of the sixth embodiment, wherein $I1/I2 \geq 1.2$ when the magnetic film is rotated in-plane relative to the magnetic coil by about 30 degrees.

An eight embodiment is the magnetic film of the sixth or seventh embodiment, wherein the magnetic coil has an inductance I at 200 kHz prior to being disposed proximate the magnetic film, and wherein $I1/I \geq 5$.

A ninth embodiment is a magnetic film comprising one or more magnetically conductive layers cracked to form pluralities of at least first and second through-cracks defining a plurality of magnetically conductive segments, the first through-cracks extending along a first direction and forming a first regular pattern along an orthogonal second direction, and the second through-cracks extending along a third direction, different than the first direction, and forming a second regular pattern along an orthogonal fourth direction such that a two-dimensional Fourier transform of the first and second regular patterns comprises respective first and second peaks along the respective second and fourth directions, wherein in a top plan view, the first through-cracks have an average width V1 along the second direction, and the second through-cracks have an average width V2 along the fourth direction, V1>V2. In some embodiments, V1/V2>1.1. In some embodiments, the first and third directions define an oblique angle therebetween. In some embodiments, the first and third directions are substantially orthogonal.

A tenth embodiment is a magnetic film comprising one or more magnetically conductive layers, each magnetically conductive layer defining a plurality of through-cracks therein, such that when the magnetic film is laid substantially flat and a magnetic coil is disposed proximate the magnetic film with the magnetic coil generating magnetic flux lines that traverse substantially parallel to, and extend across, at least a portion of the magnetic film, the magnetic coil has a first resistance R1 at 200 kHz when the magnetic film has a first in-plane orientation, and a second resistance R2 at 200 kHz when the magnetic film is rotated in-plane relative to the magnetic coil by an angle greater than about 15 degrees to have a second in-plane orientation, R1>R2. In some embodiments, R1/R2≥1.1.

An eleventh embodiment is a magnetic film comprising one or more magnetically conductive layers defining a plurality of through-cracks therein, such that when the magnetic film is laid substantially flat and a magnetic coil is disposed proximate the magnetic film with the magnetic coil generating magnetic flux lines at 200 kHz that traverse substantially parallel to, and extend across, at least a portion of the magnetic film, the magnetic coil has maximum inductance Imax when the magnetic film has a first in-plane orientation, and a minimum inductance Imin when the magnetic film is rotated in-plane relative to the magnetic coil to have a different second in-plane orientation, Imax/Imin>1.5. In some embodiments, Imax/Imin>1.8 or Imax/Imin>2. In some embodiments, the second in-plane orientation is rotated in-plane relative to the first in-plane orientation by about 90 degrees.

A twelfth embodiment is a magnetic film comprising one or more magnetically conductive layers cracked to form a plurality of through-cracks forming a regular pattern, such that when the magnetic film is laid substantially flat and an assembly is formed by disposing a magnetic coil proximate the magnetic film with the magnetic coil generating magnetic flux lines that traverse substantially parallel to, and extend across, at least a portion of the magnetic film, the magnetic coil has an inductance that is greater than an inductance of a comparative assembly that has a same construction except that the one or more conductive layers of the magnetic film of the comparative assembly are cracked to form a plurality of first through-cracks forming an irregular pattern, even when a number of turns in the magnetic coil of the comparative assembly is increased by about 30%.

A thirteenth embodiment is the magnetic film of the twelfth embodiment, wherein the magnetic coil of the assembly has a first inductance I1 at 200 kHz and a second inductance I2 at 200 kHz when the magnetic film of the assembly is rotated in-plane relative to the magnetic coil of the assembly by about 90 degrees, I1/I2≥2. In some embodiments, the magnetic coil of the comparative assembly has a first inductance Ic1 at 200 kHz and a second inductance Ic2 at 200 kHz when the magnetic film of the comparative assembly is rotated in-plane relative to the magnetic coil of the comparative assembly by about 90 degrees, Ic1 and Ic2 being approximately equal.

A fourteenth embodiment is a magnetic film comprising a first magnetically conductive layer comprising a plurality of discrete sections, each section cracked to form a plurality of through-cracks extending along a first direction and forming a regular pattern along an orthogonal second direction at a first pitch such that a Fourier transform of the regular pattern comprises a peak along the second direction at a spatial frequency corresponding to the first pitch, the second direction for at least one section in the plurality of discrete sections being different from the second direction for at least one other section in the plurality of discrete sections. In some embodiments, the second direction for at least one section in the plurality of discrete sections forms an oblique angle with the second direction for at least one other section in the plurality of discrete sections.

A fifteenth embodiment is the magnetic film of the fourteenth embodiment, wherein the second direction for each section in the plurality of discrete sections is substantially along a radial direction from a center of the first magnetically conductive layer.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof

What is claimed is:

1. A magnetic film comprising one or more magnetically conductive layers, each magnetically conductive layer cracked to form a plurality of first through-cracks defining a plurality of magnetically conductive segments, the first through-cracks extending along a first direction and forming a first regular pattern along an orthogonal second direction at a first pitch P1, such that a Fourier transform of the first regular pattern comprises a first peak along the second direction at a first spatial frequency corresponding to the first pitch P1, the first through-cracks having an average length L1 along the first direction, L1/P1≥5.

2. The magnetic film of claim 1, wherein each magnetically conductive layer is cracked to further form a plurality of second through-cracks extending along the second direction and forming a second regular pattern along the first direction at a second pitch P2, such that a Fourier transform of the second regular pattern comprises a second peak along the second direction at a second spatial frequency corresponding to the second pitch P2.

3. The magnetic film of claim 2, wherein in a top plan view, the first through-cracks have an average width W1 along the second direction, and the second through-cracks have an average width W2 along the first direction, W1>W2.

4. The magnetic film of claim 1, wherein the one or more magnetically conductive layers are disposed on a substrate.

5. The magnetic film of claim 1, wherein the one or more magnetically conductive layers comprises a plurality magnetically conductive layers stacked along a thickness direction of the magnetic film.

6. The magnetic film of claim 1, wherein when the magnetic film is laid substantially flat and a magnetic coil is disposed proximate the magnetic film with the magnetic coil generating magnetic flux lines that traverse substantially parallel to, and extend across, at least a portion of the magnetic film, the magnetic coil has a first inductance I1 at 200 kHz when the magnetic film has a first in-plane orientation, and a second inductance I2 at 200 kHz when the magnetic film is rotated in-plane relative to the magnetic coil by an angle greater than about 15 degrees to have a second in-plane orientation, I1>I2.

7. The magnetic film of claim 6, wherein I1/I2≥1.2 when the magnetic film is rotated in-plane relative to the magnetic coil by about 30 degrees.

8. The magnetic film of claim 6, wherein the magnetic coil has an inductance I at 200 kHz prior to being disposed proximate the magnetic film, and wherein I1/I≥5.

9. A magnetic film comprising one or more magnetically conductive layers cracked to form pluralities of at least first and second through-cracks defining a plurality of magnetically conductive segments, the first through-cracks extending along a first direction and forming a first regular pattern along an orthogonal second direction at a first pitch P1, and the second through-cracks extending along a third direction, different than the first direction, and forming a second regular pattern along an orthogonal fourth direction such that a two-dimensional Fourier transform of the first and second regular patterns comprises respective first and second peaks along the respective second and fourth directions, wherein in a top plan view, the first through-cracks have an average width V1 along the second direction, and the second through-cracks have an average width V2 along the fourth direction, V1>V2, the first through-cracks having an average length L1 along the first direction, L1/P1>5.

10. The magnetic film of claim 9, wherein when the magnetic film is laid substantially flat and a magnetic coil is disposed proximate the magnetic film with the magnetic coil generating magnetic flux lines that traverse substantially parallel to, and extend across, at least a portion of the magnetic film, the magnetic coil has a first resistance R1 at 200 kHz when the magnetic film has a first in-plane orientation, and a second resistance R2 at 200 kHz when the magnetic film is rotated in-plane relative to the magnetic coil by an angle greater than about 15 degrees to have a second in-plane orientation, R1>R2.

11. The magnetic film of claim 9, wherein when the magnetic film is laid substantially flat and a magnetic coil is disposed proximate the magnetic film with the magnetic coil generating magnetic flux lines at 200 kHz that traverse substantially parallel to, and extend across, at least a portion of the magnetic film, the magnetic coil has maximum inductance Imax when the magnetic film has a first in-plane orientation, and a minimum inductance Imin when the magnetic film is rotated in-plane relative to the magnetic coil to have a different second in-plane orientation, Imax/Imin>1.5.

12. The magnetic film of claim 9, wherein when the magnetic film is laid substantially flat and an assembly is formed by disposing a magnetic coil proximate the magnetic film with the magnetic coil generating magnetic flux lines that traverse substantially parallel to, and extend across, at least a portion of the magnetic film, the magnetic coil has an inductance that is greater than an inductance of a comparative assembly that has a same construction except that the one or more conductive layers of the magnetic film of the comparative assembly are cracked to form a plurality of first through-cracks forming an irregular pattern, even when a number of turns in the magnetic coil of the comparative assembly is increased by about 30%.

13. The magnetic film of claim 12, wherein the magnetic coil of the assembly has a first inductance I1 at 200 kHz and a second inductance I2 at 200 kHz when the magnetic film of the assembly is rotated in-plane relative to the magnetic coil of the assembly by about 90 degrees, I1/I2≥2.

14. A magnetic film comprising a first magnetically conductive layer comprising a plurality of discrete sections, each section cracked to form a plurality of through-cracks extending along a first direction and forming a regular pattern along an orthogonal second direction at a first pitch such that a Fourier transform of the regular pattern comprises a peak along the second direction at a spatial frequency corresponding to the first pitch, the second direction for at least one section in the plurality of discrete sections being different from the second direction for at least one other section in the plurality of discrete sections, wherein for each section in the plurality of discrete sections, each pair of adjacent through-cracks in the plurality of through-cracks defines a portion of the section extending continuously along the second direction from a first edge of the section to a different second edge of the section.

15. The magnetic film of claim 14, wherein the second direction for each section in the plurality of discrete sections is substantially along a radial direction from a center of the first magnetically conductive layer.

* * * * *

UNITED STATES PATENT AND TRADEMARK OFFICE
CERTIFICATE OF CORRECTION

| | | |
|---|---|---|
| PATENT NO. | : 11,328,850 B2 | Page 1 of 1 |
| APPLICATION NO. | : 16/904997 | |
| DATED | : May 10, 2022 | |
| INVENTOR(S) | : Jinwook Kim | |

It is certified that error appears in the above-identified patent and that said Letters Patent is hereby corrected as shown below:

In the Claims

Column 17
Line 52, In Claim 9, delete "$L1/P1>5$" and insert -- $L1/P1 \geq 5$ --, therefor.

Signed and Sealed this
Thirtieth Day of May, 2023

Katherine Kelly Vidal
*Director of the United States Patent and Trademark Office*